United States Patent [19]
Watanabe et al.

[11] Patent Number: 5,856,686
[45] Date of Patent: Jan. 5, 1999

[54] AMPLIFYING TYPE SOLID-STATE IMAGING APPARATUS AND METHOD FOR DRIVING THE SAME

[75] Inventors: Takashi Watanabe, Soraku-gun; Hiroaki Kudo, Nara, both of Japan

[73] Assignee: Sharp Kabushiki Kaisha, Osaka, Japan

[21] Appl. No.: 816,393

[22] Filed: Mar. 13, 1997

[30] Foreign Application Priority Data

Mar. 18, 1996 [JP] Japan .................... 8-061532

[51] Int. Cl.$^6$ ................ H01L 31/062; H01L 31/113
[52] U.S. Cl. ............... 257/291; 257/258; 327/515; 250/208.1; 348/300; 348/302
[58] Field of Search .................. 257/258, 257, 257/290, 291; 327/515; 250/208.1; 348/300, 302

[56] References Cited

U.S. PATENT DOCUMENTS

| | | | |
|---|---|---|---|
| 4,589,027 | 5/1986 | Nakamura et al. | 257/291 |
| 4,857,981 | 8/1989 | Matsumoto et al. | 257/291 |
| 4,929,994 | 5/1990 | Matsumoto | 257/291 |
| 5,172,249 | 12/1992 | Hashimoto | 358/482 |
| 5,285,091 | 2/1994 | Hamasaki | 257/292 |
| 5,317,174 | 5/1994 | Hynecek | 257/222 |
| 5,430,312 | 7/1995 | Yamada | 257/291 |
| 5,486,711 | 1/1996 | Ishida | 257/291 |

FOREIGN PATENT DOCUMENTS 2 291 256   1/1996   United Kingdom .

OTHER PUBLICATIONS

J. Hynecek, *IEEE Transactions on Elelctron Devices*, vol. 35, No. 5, pp. 646–652, 1988.

K. Matsumoto, et al. *IEEE Transactions on Electron Devices*, vol. 38, No. 5, pp. 989–998, 1991.

J. Hynecek, *IEEE Transactions on Electron Devices*, vol. 38, No. 5, pp. 1011–1020, 1991.

E.R. Fossum, *IEDM*, pp. 17–25, 1995.

T. Nakamura, et al. *Jurnal of Television Society*, vol. 41, pp. 1047–1053, 1987, with partial English Translation.

C. Sequin, et al. *Charge Transfer Devices, Basics and Applications of CCDs and BBDs*, pp. 49–50, 1978 with partial English Translation.

*Primary Examiner*—Ngân V. Ngô
*Attorney, Agent, or Firm*—Dike, Bronstein, Roberts & Cushman, LLP; David G. Conlin; Brian L. Michaelis

[57] ABSTRACT

An amplifying type solid-state imaging apparatus includes an amplifying type photoelectric conversion device. The device including a transistor for accumulating a charge generated by incident light as a signal charge in a charge accumulation region proximate to the surface of the semiconductor substrate and for outputting a signal in accordance with the accumulated signal charge, and a resetting section provided adjacent to the transistor for performing a resetting operation. The signal charge accumulated in the transistor is discharged from the charge accumulation region based on an applied voltage. The device further includes a signal line for carrying a signal output from the transistor, a clamp circuit for clamping the voltage of the signal line at a first voltage, a sample hold circuit for sample-holding a difference signal representing a difference between the first voltage and a second voltage output from the transistor after the resetting operation, an output line connected to the sample hold circuit, and a controlling circuit for controlling the clamp circuit and the sample hold circuit and for reading out the difference signal held in the sample hold circuit to the output line.

17 Claims, 27 Drawing Sheets

PRIOR ART

PRIOR ART

PRIOR ART

PRIOR ART

PRIOR ART

PRIOR ART

AMPLIFYING TYPE SOLID-STATE IMAGING APPARATUS AND METHOD FOR DRIVING THE SAME

BACKGROUND OF THE INVENTION

1. Field of the Invention

The present invention relates to an amplifying type solid-state imaging apparatus in which amplifying type solid-state imaging devices are arranged in a matrix configuration, each of the amplifying type solid-state imaging devices amplifying a signal within a pixel by a transistor such as an MOS (Metal-Oxide-Semiconductor) FET (Field Effect Transistor) or a junction gate type FET.

2. Description of the Related Art

In order to replace a charge-coupled device (CCD) which is currently in wide use in a solid-state imaging apparatus, an amplifying type solid-state imaging apparatus is proposed. The amplifying type solid-state imaging apparatus does not read out a signal charge generated in a pixel as it is but amplifies it within the pixel, and then successively reads out the amplified signal charge by a scanning circuit. By amplifying the signal charge within the pixel, an amount of signals is sufficiently secured. Moreover, the limitation of an amount of signals in connection with the read-out is eliminated, and a dynamic range becomes better for the amplifying type device than for the CCD. Furthermore, it is sufficient to drive only the horizontal and vertical lines and the selection switch, which include pixels from which the signal is to be read out. As a result, the amplifying type solid-state imaging device is characterized with lower driving voltage and less power consumption than the CCD.

Transistors are typically used for amplifying a signal within each pixel. Depending on the type of transistors used, the amplifying type solid-state imaging device is categorized into an SIT type, a bipolar type, an FET type (MOS type or junction type), etc. In the SIT type and bipolar type devices, the scanning circuit for reading out the signal charge typically has a transistor structure constructed in the depth-direction. Since the MOS-FET type device has a transistor structure constructed parallel to the substrate surface, the MOS-FET type device has a simpler structure and can be readily produced. Therefore, it is structurally advantageous to employ the FET type device to a pixel when the overall structure of the apparatus is under consideration. Furthermore, the FET type device where the pixel includes a single FET is advantageous in increasing the pixel density. Reported as this type are a CMD (Charge Modulation Device) type, an FGA (Floating Gate Array) type, a BCM (Bulk Charge Modulated Device) type, etc.

FIGS. 1A and 1B illustrate a pixel of a conventional CMD type amplifying type solid-state imaging apparatus. FIG. 1A is a plan view of the pixel, and FIG. 1B is a cross-sectional view of the pixel taken along the G—G line in FIG. 1A. The CMD type pixel structure shown in FIGS. 1A and 1B is reported, for example, in "Gate accumulating type MOS phototransistor image sensor" by Nakamura et al., 1986 National Convention of the Institute of Television Engineers of Japan, page 57.

As illustrated in FIG. 1B, an n-type well 2 is formed on a p-type substrate 1 as a buried channel, and a gate electrode 4 is formed on the n-type well 2 with an insulating film 3 being inserted therebetween. A source region 5 and a drain region 6 which are made of a high concentration n$^+$-type layer and are separated from each other are also formed to the surface side of the n-type well 2.

As illustrated in FIG. 1A, the gate electrode 4 of each of the pixels arranged in the horizontal direction are all connected to a gate terminal 7, and the source region 5 of each of the pixels arranged in the vertical direction are all connected to a source terminal 8. Furthermore, each drain region 6 connects pixels in a mesh-like manner, and this drain region 6 is connected to a drain terminal 9. A plurality of such pixels are arranged both in the horizontal and vertical directions so as to form a matrix, thereby constituting a CMD type pixel unit.

Hereinafter, the operation of the CMD type pixel unit whose structure is described above will be described.

FIG. 2 shows the potential distribution in the depth-direction taken along the H—H line in FIG. 1B. As illustrated in FIG. 2, a voltage $V_L$ is applied as a gate voltage to the respective gate electrodes 4 of pixels arranged in the horizontal direction via the corresponding gate terminal 7, and a signal charge (positive holes) generated by photoelectric conversion in each pixel arranged in the horizontal direction is accumulated at the interface of the semiconductor and the insulator 3. Next, when reading out the signal, the gate voltage applied to the gate electrodes 4 is changed to a voltage $V_M$ which is higher than the voltage $V_L$. When this is being done, the current flowing between the drain region 6 and the source region 5 of the transistor changes depending on the amount of accumulated signal charge. This changed current is to be read out as a signal output through the source terminal 8. When the changed current is being read out, since the gate voltage applied to other pixels connected to the same source terminal 8 remains at $V_L$ through other gate terminals 7, signal outputs from other pixels are not sensed.

Furthermore, the resetting operation which resets the pixels by clearing the accumulated signal charges and prepares the pixels for next signal accumulation is performed by changing the gate voltage applied to the gate electrodes 4 to a voltage $V_H$ so that a potential gradient which monotonically decreases in the depth-direction is provided. The signal charge (positive holes in this case) accumulated at the interface of the n-type well 2 and the insulating film 3 is discharged to the p-type substrate 1 side immediately below as illustrated by the broken lines in FIG. 1B.

In the above-described conventional CMD type pixels, if the impurity concentration of the buried channel layer which functions as the n-type well 2 is raised in order to increase the signal charge accumulation density, then the gate voltage $V_H$ during the above-described resetting operation must be set extremely high.

For example, the gate voltage $V_H$ during the resetting operation will be considered under the following conditions (condition 1).

(Condition 1)
Concentration in substrate: $1.0 \times 10^{15}$ cm$^{-3}$
Concentration in n-type layer: $3.0 \times 10^{15}$ cm$^{-3}$
Thickness of n-type layer: 1.5 $\mu$m
Thickness of gate insulating film: 80 nm Under Condition 1, the critical condition for the potential to be monotonically decreasing from the surface of the n-type well 2 to the p-type substrate 1 is given by the following equation (1).

$$V_G = \frac{qN_n}{2K_s\epsilon_o}\left(1 + \frac{N_n}{N_P}\right)d_n^2 - V_{FB} \qquad (1)$$

$$= 20.88 - 0.85 = 20.03 \text{V}$$

where $N_n$ denotes carrier concentration of the n-type well 2, $N_P$ denotes carrier concentration of the p-type substrate 1, $K_s$ denotes a dielectric constant of the substrate 1, $\epsilon_o$ denotes the permittivity in vacuum, q denotes the elementary electric charge, and $D_n$ denotes a junction depth $X_j$ of the n-type well 2.

Therefore, in the case where the flat band voltage is $V_{FB}=-0.85$ V, the gate voltage $V_H$ required for the resetting operation is calculated to be $V_H=20.0$ V from Equation (1), which is unpractically high.

Furthermore, other problems experienced by the conventional CMD type pixels include a large quantity of dark current due to the depletion at the interface between the n-type well 2 and the insulating film 3 when surrounding environment is dark.

In order to reduce the dark current in the FET type amplifying type solid-state imaging apparatus, an FGA type amplifying type solid-state imaging apparatus is proposed.

FIG. 3A is a cross-sectional view of a pixel of a conventional FGA type amplifying type solid-state imaging apparatus, and FIG. 3B shows the potential distribution in the depth-direction taken along the line K—K in FIG. 3A. This conventional technique is reported in "A New Device Architecture Suitable for High-Resolution and High-Performance Image Sensor", by J. Hynecek, IEEE Trans. Elec. Dev., p 646, (1988). In FIG. 3A, elements having similar functions as in FIG. 1A are designated by the same reference numerals and the descriptions thereof are omitted.

This FGA type device differs from the CMD type device in that a p$^+$-type layer 10 having relatively high impurity concentration is provided in a region of the n-type well 2 under the gate electrode 4 as illustrated in FIG. 3A.

In the FGA type amplifying type solid-state imaging apparatus having the above structure, the gate voltage is set at a voltage $V_L$ during the accumulation and read-out of a signal as illustrated in FIG. 3B. Then, a change in the channel potential in the n-type well 2 due to the accumulation of a signal charge (positive hole) in the p$^+$ layer 10 is read out as a change in the threshold value. Other pixels connected to the same signal line are not read out since the gate voltage applied to these pixels is not $V_L$.

Following the read-out operation, the resetting operation is similar to that of the above-described CMD type device. By changing the gate voltage to a voltage $V_H$ when resetting so as to provide a potential gradient which is monotonically decreasing in the depth-direction, the signal charge (positive hole) accumulated in the p$^+$-type layer is discharged to the p-type substrate 1 side directly below. Since this p$^+$-type layer 10 does not become depleted during the resetting operation, the dark current can be prevented. However, the fact that the p$^+$-type layer 10 does not become depleted also means that the signal charge is not completely transferred. This causes generation of an after image and an increase in the resetting noise.

In order to further improve the FGA type amplifying type solid-state imaging apparatus, a BCMD type amplifying type solid-state imaging apparatus has been proposed ("BCMD-An Improved Photosite Structure for High Density Image Sensor" by J. Hynecek, IEEE trans. Elec. Dev., p 1011, (1991)).

FIG. 4A is a cross-sectional view of a pixel of a conventional BCMD type amplifying type solid-state imaging apparatus, and FIG. 4B is a potential distribution in the depth-direction taken along the sectioning line L—L in FIG. 4A.

In FIG. 4A, the pixel of the BCMD type device includes a p-type layer 12, an n-type layer 13 and another p-type layer 14 successively deposited in this order on an n-type substrate 11. Then, a high impurity concentration p$^+$-type layer 15 which is intended for the source and the drain extending through the p-type layer 12, the n-type layer 13 and the p-type layer 14 is formed.

Comparing to the pixel of the above-described FGA type device, the pixel of the BCMD type device differs in that the signal charges are electrons accumulated in the n-type layer 13 functioning as the buried channel, that a potential change in the p-type layer 14 at the surface due to the signal charge is sensed as a change in the threshold value of P-MOS, and that the substrate 11 is an n-type and the gate voltage is set at a low voltage $V_L$ during the resetting operation so that the signal charge is discharged to the n-type substrate 11 side.

In this manner, a complete transfer of the signal charge is achieved. However, this structure requires the p-n-p-n multi-layer structure. As a result, the optimization of driving conditions becomes difficult to achieve, and its fabrication also becomes too complicated.

In order to solve those problems associated with each of the above-described amplifying type solid-state imaging apparatuses, the applicant of the present invention proposed four kinds of new structures to be described below, and separately filed the inventions in Japanese Patent Application Nos. 6-30953, 7-51641, 8-19199 and 8-19200, respectively.

FIG. 5 is a cross-sectional view of a pixel having a so-called TGMIS (Twin Gate MOS Image Sensor) type structure disclosed in Japanese Patent Application 6-30953. In the figure, an n-type well layer 62 is provided to the surface side of a p-type semiconductor substrate 61, and a source region 50 and a drain region 45 of the MOS-FET are provided to the surface side of the n-type layer 62. Furthermore, a first gate (photo gate) electrode 46 is provided on the n-type layer 62 with an insulating film 63 being inserted therebetween, and a second gate (resetting gate) electrode 48 is provided on the p-type semiconductor substrate 61 also with the insulating film 63 being inserted therebetween.

The first gate electrode 46 is connected to a control voltage terminal to which a read-out scanning voltage $V_A$ is applied. The source region 50 of the MOS-FET including the first gate electrode 46 as a gate is connected to a source terminal through which a pixel signal voltage $V_S$ read out from the pixel is obtained, and the drain region 45 of each pixel is connected to a drain terminal to which a drain voltage $V_D$ is applied.

Hereinafter, the operation of the above-described structure will be described.

First, a photon having optical energy hv entering through the first gate electrode 46 creates an electron-hole pair due to photoelectric conversion, and the electron thus created flows into the drain region 45. The positive hole is confined by the potential barrier formed in the middle portion of the n-type layer 62 and by the potential barrier formed under the second gate electrode 48. The positive holes accumulate at the interface of the n-type layer 62 between the semiconductor and the insulating film as a signal charge.

A change in the potential within the n-type layer 62 in accordance with the signal charge can be read out as a voltage change in the source region 50, regarding it as an output signal of the pixel voltage.

The discharge of the signal charge is readily performed by lowering the potential barrier under the second gate electrode 48. The signal charge then flows to the p-type semiconductor substrate 61 side through the path indicated by the broken line in FIG. 5.

For example, in the structure where the signal charge is extracted directly to the substrate side as for the conventional CMD type, sufficient resetting cannot be performed unless relatively high voltage (10 V, for example) is applied to the first gate electrode. Moreover, if the impurity concentration in the n-type well layer is made small, a sufficient amount of charge cannot be accumulated. If the impurity concentration in the n-type well layer is made large, then a sufficient amount of accumulated charge can be obtained but, on the other hand, sufficient resetting cannot be performed unless high voltage (20 V, for example) is applied to the resetting gate. However, in the structure where the signal charge to be reset is first extracted in the horizontal direction and then to the substrate side as illustrated in FIG. 5, since the n-type well having the high impurity concentration can be used and a sufficient amount of the signal charge can be accumulated at the surface, a signal charge amount of sufficiently large magnitude can be handled and, at the same time, the resetting operation can be performed at lower voltage.

However, a problem still remains which is common to all currently known amplifying type solid-state imaging apparatuses, and the problem is associated with a fixed pattern noise (FPN) arising from the fluctuation of signal levels and amplification factors among pixels. Hereinafter, this problem associated with FPN will be described in detail with reference to the above-described TGMIS type amplifying type solid-state imaging apparatus as an example.

FIG. 6 schematically illustrates the structure of a two-dimensional amplifying-type solid-state imaging apparatus utilizing TGMIS type amplifying type solid-state imaging devices. A predetermined DC voltage $V_D$ is applied to a common drain 25 of each pixel such as pixels 21, 22, 23 and 24. First gate electrodes 26 of pixels arranged in the horizontal direction, such as pixels 21 and 22, are all connected to a first scanning line 26a placed in the horizontal direction so that a read-out operation is performed by a first vertical scanning circuit 27 via the first scanning line 26a. Second gate electrodes 28 of the same pixels as above arranged in the horizontal direction, such as pixels 21 and 22, are all connected to a second scanning line 28a placed in the horizontal direction so that a resetting operation is performed by a second vertical scanning circuit 29 via the second scanning line 28a in units of the horizontally-arranged pixels. Furthermore, source electrodes 30 of pixels arranged in the vertical direction, such as pixels 21 and 23 or pixels 22 and 24, are all connected to a signal line 31 in units of such pixels, and further connected to a video line 34 via a switching transistor 33 whose ons and offs are controlled by a horizontal scanning circuit 32. Furthermore, an MOS transistor 36 which provides a constant current load is connected to the output terminal 35 of the video line 34. This completes the construction of the two-dimensional amplifying type solid-state imaging apparatus utilizing the TGMIS type amplifying type solid-state imaging devices.

FIG. 7A is a timing chart for driving the two-dimensional amplifying type solid-state imaging apparatus in FIG. 6, and FIG. 7B is a structural diagram of its output signal.

In FIG. 7A, the scanning signal $\phi GI(i)$ is a control clock signal which is successively output from the first vertical scanning circuit 27 to the i-th group from the top of the first gate electrodes 26 of pixels arranged in the horizontal direction, and the scanning signal $\phi GII(i)$ is a control clock signal which is successively output from the second vertical scanning circuit 29 to the i-th group from the top of the second gate electrodes 28 of pixels arranged in the horizontal direction. For example, the scanning signal $\phi GI(1)$ from the first vertical scanning circuit 27 is input to the first gate electrodes 26 of pixels arranged in the horizontal direction such as pixels 21 and 22 so that read-out operation from pixels such as pixels 21 and 22 is selected.

Then, if the first gate electrodes 26 and the second gate electrodes 28 of the i-th group of horizontally arranged pixels from the top are at high levels VG(H) and VRG(H), respectively, while the first gate electrodes 26 and the second gate electrodes 28 of other pixels are all at low levels VG(L) and VRG(L), respectively, then only the pixel signals stored in the i-th group of horizontally arranged pixels from the top can be read out to the signal lines 31. The clock pulses $\phi S1$, $\phi S2$, $\phi S3$, etc. which are output from the horizontal scanning circuit 32 during the period ($\tau H$) successively select the signal line 31 placed in the vertical direction by controlling ons and offs of the switching transistors 33. Then, the pixel signals from the i-th group of vertically arranged pixels from the left are output to the video line 34 as output signals via the signal line 31 and the switching transistor 33.

Then, during the period ($\tau BL$) in which the first gate electrodes 26 of the i-th group of horizontally arranged pixels from the top are at high level VG(H) but the second gate electrodes 28 of the same group of pixels are at low level VRG(L), the resetting operation is performed by the second vertical scanning circuit 29 in units of pixels arranged in the horizontal direction.

As illustrated in FIG. 7B, the signal output waveform of the pixel signal obtained by the clock pulses $\phi S1$, $\phi S2$, $\phi S3$, etc. also includes a fluctuation component of an output voltage when there is no optical input (photoelectrically generated and accumulated charge is zero) to the pixels of the amplifying type solid-state imaging devices which are successively selected. As a result, it is not possible to obtain only the signal amount of the output signal due to the net amount of photoelectrically generated and accumulated charge, posing a problem associated with a fixed pattern noise arising from the fluctuation of signal level and amplification factor of each pixel.

SUMMARY OF THE INVENTION

According to one aspect of the present invention, an amplifying type solid-state imaging apparatus, includes: an amplifying type photoelectric conversion device including: a transistor formed on a surface of a semiconductor substrate, the transistor accumulating a charge generated by incident light as a signal charge in a charge accumulation region proximate to the surface of the semiconductor substrate and outputting a signal in accordance with the accumulated signal charge; and a resetting section provided adjacent to the transistor, the resetting section performing a resetting operation wherein the signal charge accumulated in the transistor is discharged from the charge accumulation region based on an applied voltage; a signal line for carrying a signal output from the transistor of the amplifying type photoelectric conversion device; a clamp circuit connected to the signal line, for clamping the voltage of the signal line at a first voltage; a sample hold circuit connected to the clamp circuit, for sample-holding a difference signal representing a difference between the first voltage and a second voltage output from the transistor after the resetting operation; an output line connected to the sample hold circuit; and a controlling circuit for controlling the clamp circuit and the sample hold circuit and for reading out the difference signal held in the sample hold circuit to the output line.

In one embodiment of the present invention, the resetting section includes a gate region which is provided adjacent to the charge accumulation region and includes a part of the surface of the semiconductor substrate, and a gate electrode formed on the part of the surface of the semiconductor substrate with an insulating film being inserted therebetween, the accumulated signal charge being transferred from the charge accumulation region to the inside of the semiconductor substrate in accordance with a voltage applied to the gate electrode.

In one embodiment of the present invention, the transistor includes a first gate region including a first gate electrode formed on the surface of the semiconductor substrate and the charge accumulation region, and a source region and a drain region which are formed on the semiconductor substrate as a high impurity concentration layer, the signal being output from the source region in accordance with the signal charge. The resetting section includes: a channel region which is a part of the semiconductor substrate proximate to the surface and adjacent to the charge accumulation region; a charge discharge drain region provided as a high impurity concentration layer adjacent to the channel region; and a second gate electrode provided on the channel region and the charge discharge drain region with an insulating film being inserted therebetween, the first gate electrode adjoining thereby. The resetting section transfers the signal charge accumulated in the charge accumulation region, based on a voltage applied to the second gate electrode, from the charge accumulation region to the charge discharge drain region via the channel region.

In one embodiment of the present invention, the amplifying type solid-state imaging apparatus includes a plurality of the amplifying type photoelectric conversion devices arranged in a one-dimensional or two-dimensional matrix configuration. Each of the plurality of amplifying type photoelectric conversion devices being such that: the transistor includes a first gate region including a first gate electrode formed on the surface of the semiconductor substrate and the charge accumulation region, and a source region and a drain region which are formed on the semiconductor substrate as a high impurity concentration layer, the signal being output from the source region in accordance with the signal charge; the resetting section includes a second gate region which is provided adjacent to the charge accumulation region and includes a part of the surface of the semiconductor substrate, and a second gate electrode formed on the second gate region with an insulating film being inserted therebetween, the signal charge accumulated in the charge accumulation region being transferred, based on a voltage applied to the second gate electrode, from the charge accumulation region to the inside of the semiconductor substrate via the second gate region; and an electric field blocking part is provided between the second gate region of the resetting section of one of the plurality of amplifying type photoelectric conversion devices and the transistor of an amplifying type photoelectric conversion device adjacent to the one of the plurality of amplifying type photoelectric conversion devices.

In one embodiment of the present invention, the electric field blocking part is a trench structure provided to the semiconductor substrate.

In one embodiment of the present invention, a constant current circuit is connected to the signal line.

In one embodiment of the present invention, an amplifying circuit for the output line is provided, and a capacitor device and a switching device are provided in parallel between an input terminal and an output terminal of the amplifying circuit.

In one embodiment of the present invention, a second controlling circuit which turns on the switching device for a predetermined time and then turns off immediately before one pixel worth of the difference signal is input to the input terminal of the amplifying circuit.

In one embodiment of the present invention, an amplifying type solid-state imaging apparatus according to claim 1 further includes: an impedance conversion circuit connected to the sample hold circuit; and a selection switch device connected between an output end of the impedance conversion circuit and the output line.

In one embodiment of the present invention, the amplifying type solid-state imaging apparatus includes a plurality of groups of the clamp circuit, the sample hold circuit, the impedance conversion circuit, the selection switch device and the output line; and the signal line connected to the amplifying type photoelectric conversion device is connected in parallel to the plurality of the clamp circuits. The corresponding sample hold circuit and the impedance conversion circuit are respectively connected to the plurality of the clamp circuits; and the output end of the impedance conversion circuit is connected to corresponding the output line via corresponding the selection switch device.

According to another aspect of the present invention, an amplifying type solid-state imaging apparatus includes: an amplifying type photoelectric conversion device including: a first region provided in a semiconductor substrate so as to include a part of a surface of the semiconductor substrate, for accumulating a charge generated by photoelectric conversion as a signal charge; a first drain region which is a high impurity concentration layer formed in the first region; a first gate region including a surface-proximate portion of the substrate of the first region excluding the first drain region, an insulating film formed on the first region, and a first electrode formed on the insulating film; a second gate region including a second region provided adjacent to the first gate region, and a second gate electrode provided on the second region with the insulating film being inserted therebetween; a second drain region provided to the outside of the first region and adjacent to the second region; wherein a first transistor having the surface-proximate region of the substrate of the first region as a channel is formed between the first drain region and the semiconductor substrate, and a second transistor having a region between the first region and the second drain region as a channel is formed, a change in an operational characteristic of the first transistor which is generated by the signal charge being used as an output signal; a signal line for carrying a signal output from the transistor of the amplifying type photoelectric conversion device; a clamp circuit connected to the signal line, for clamping a voltage of the signal line at a first voltage; a sample hold circuit connected to the clamp circuit, for sample-holding a difference signal representing a difference between the first voltage and a second voltage output from the transistor after the resetting operation; an output line connected to the sample hold circuit; and a controlling circuit for controlling the clamp circuit and the sample hold circuit and for reading out the difference signal held in the sample hold circuit to the output line.

In one embodiment of the present invention, the signal line is connected to a constant current circuit.

In one embodiment of the present invention, an amplifying circuit for the output line is provided, and a capacitor device and a switching device are provided in parallel between an input end and an output end of the amplifying circuit.

In one embodiment of the present invention, a second controlling circuit which turns on the switching device for a predetermined time and then turns off immediately before one pixel worth of the difference signal is input to the input terminal of the amplifying circuit.

In one embodiment of the present invention, an amplifying type solid-state imaging apparatus according to claim 11 further includes: an impedance conversion circuit connected to the sample hold circuit; and a selection switching device connected between an output end of the impedance conversion circuit and the output line.

In one embodiment of the present invention, the amplifying type solid-state imaging apparatus includes a plurality of groups of the clamp circuit, the sample hold circuit, the impedance conversion circuit, the selection switch device and the output line; and the signal line connected to the amplifying type photoelectric conversion device is connected in parallel to the plurality of the clamp circuits. The corresponding sample hold circuit and the impedance conversion circuit are respectively connected to the plurality of the clamp circuits; and the output end of the impedance conversion circuit is connected to corresponding the output line via corresponding the selection switch device.

According to still another aspect of the present invention, an amplifying type solid-state imaging apparatus includes: an amplifying type photoelectric conversion device, including a transistor formed on a surface of a semiconductor, the transistor accumulating a charge generated by incident light as a signal charge in a charge accumulation region proximate to the surface of the semiconductor substrate and outputting a signal in accordance with the signal charge; and a signal line for carrying a signal output from the transistor. A method for driving the amplifying type solid-state imaging apparatus includes the steps of: outputting a signal in accordance with accumulated the signal charge from the transistor of the amplifying type photoelectric conversion device to the signal line; clamping a voltage of the signal line at a first voltage; discharging the signal charge accumulated in the transistor from the charge accumulation region, thereby outputting a second voltage from the transistor; sample-holding a difference signal representing a difference between the first voltage and the second voltage; and reading out the sample-held difference signal.

Thus, the invention described herein makes possible the advantage of providing an amplifying type solid-state imaging apparatus which can considerably reduce a fixed pattern noise.

These and other advantages of the present invention will become apparent to those skilled in the art upon reading and understanding the following detailed description with reference to the accompanying figures.

DESCRIPTION OF THE PREFERRED EMBODIMENTS

Hereinafter, preferred embodiments of the present invention will be described.

(Embodiment 1)

Figure 8:
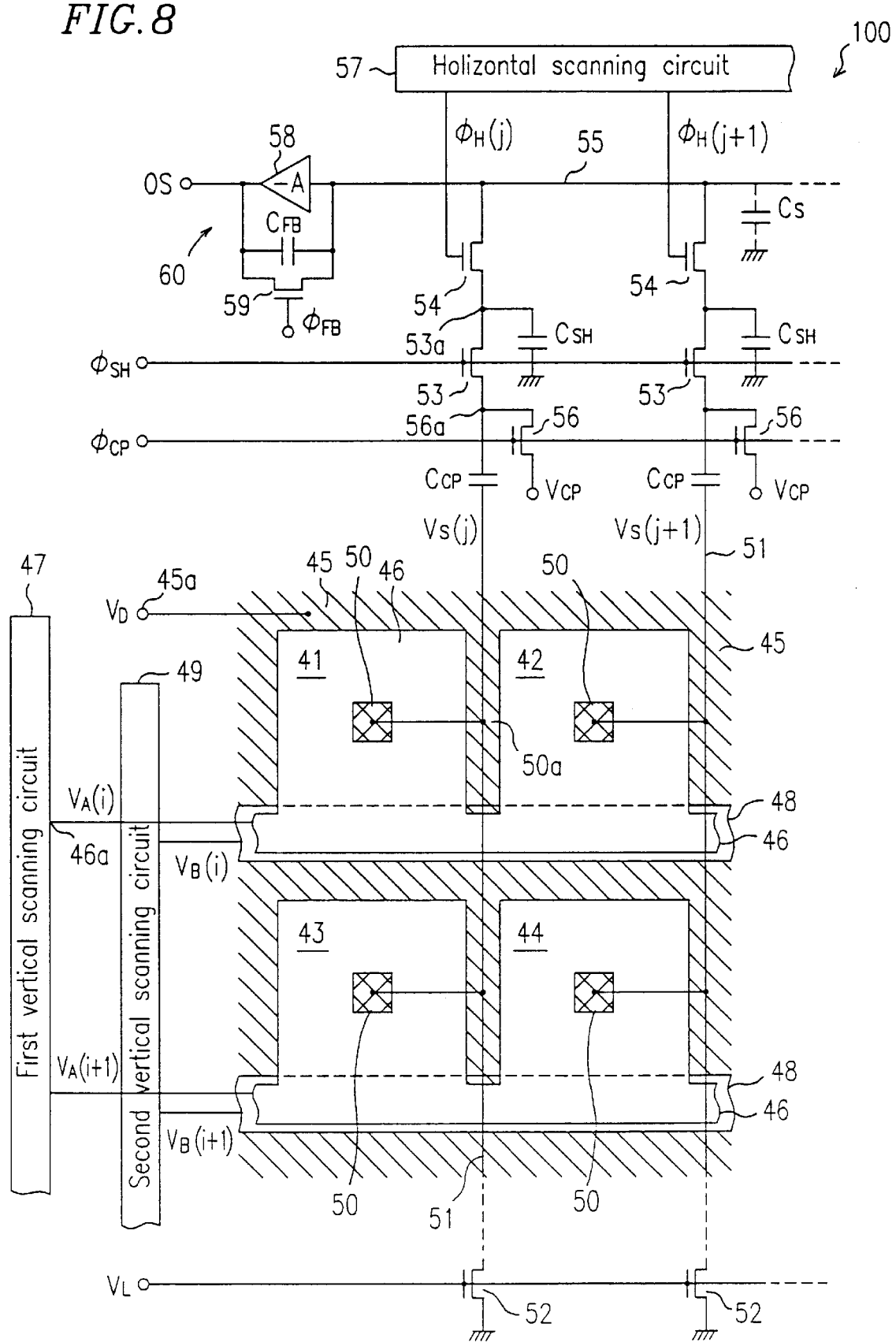
FIG. 8 is a view schematically illustrating an amplifying type solid-state imaging apparatus according to Embodiment 1.
Figure 9:
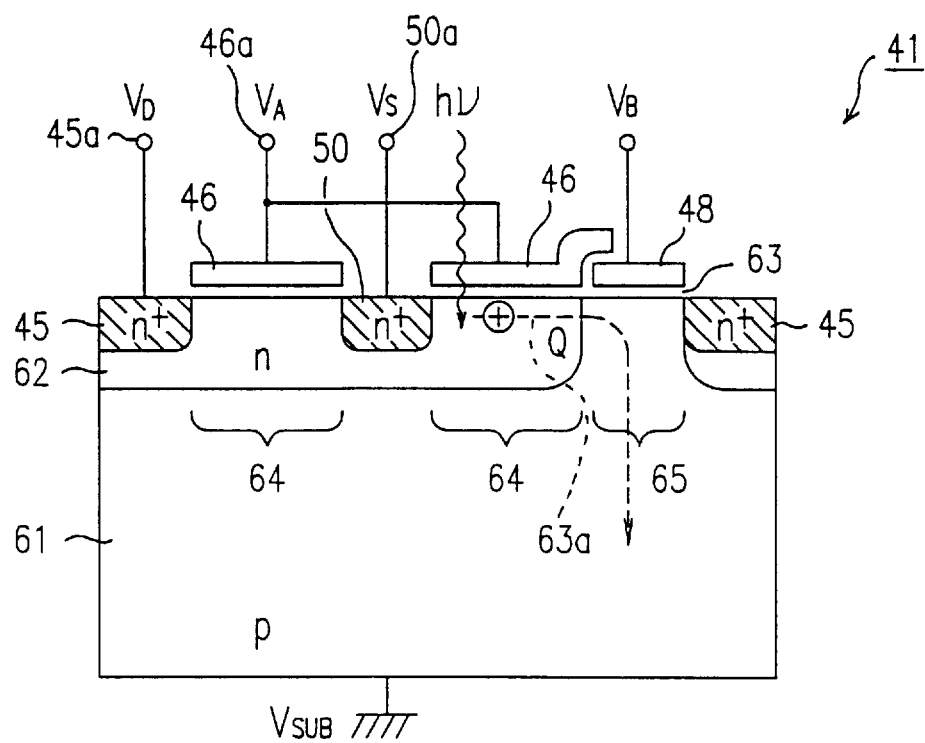
FIG. 9 is a cross-sectional view illustrating the structure of the pixel of the amplifying type solid-state imaging apparatus illustrated in FIG. 8.

FIG. 8 schematically illustrates the structure of a two-dimensional amplifying type solid-state imaging apparatus (image sensor) 100 including TGMIS type pixels according to Embodiment 1 as a combination of a plan view of the pixels and a circuit diagram. FIG. 9 is a cross-sectional view illustrating the structure of the pixel of the two-dimensional amplifying type solid-state imaging apparatus 100. In Embodiment 1, each pixel has the TGMIS structure.

As illustrated in FIG. 9, each pixel (pixel 41 in FIG. 8, for example) has an n-type well layer 62 to the surface side of a p-type semiconductor substrate 61, and a source region 50 and a drain region 45 of a MOS FET are provided to the surface side of the n-type layer 62. Moreover, a first gate (photo gate) electrode 46 is provided on the n-type layer 62 with an insulating film 63 being inserted therebetween. A second gate (resetting gate) electrode 48 is provided on the portion of the p-type semiconductor substrate 61 where the n-type well layer 62 is not provided also with the insulating film 63 being inserted therebetween.

As illustrated in FIG. 8, the first gate electrodes 46 of the pixels arranged in the horizontal direction are all connected to a control voltage terminal 46a to which a scanning voltage $V_A$ for read-out operation is applied. The source regions 50 of the MOSFETs of the pixels arranged in the vertical direction, each of the MOSFETs having the first gate electrode 46 as its gate, are all connected to source terminals 50a (signal line 51 in FIG. 8). Furthermore, drain regions 45 of pixels are all connected to a drain terminal 45a to which a drain voltage $V_D$ is applied.

Operations at the pixels are similar to those at the conventional TGMIS pixels. First, a photon having optical energy hv entering through the first gate electrode 46 creates an electron-hole pair due to photoelectric conversion. The electron thus created then flows into the drain region 45. The positive hole is confined by the potential barrier formed in the middle of the n-type layer 62 and by the potential barrier formed under the second gate electrode 48. The positive holes accumulate as a signal charge Q at the interface 63a of the semiconductor of the n-type layer 62 and the insulating film 63.

By reading out a change in potential in the n-type layer 62 in accordance with the signal charge Q as a change in voltage at the source region 50, an output signal of the pixel voltage can be obtained. As described here, the MOSFET of each pixel functions as a photosensor which outputs an electrical signal in accordance with the incident light.

By lowering the potential barrier under the second gate electrode 48, the signal charge Q can be discharged to the p-type semiconductor substrate 61 side through a path indicated by a broken line in FIG. 9. As described here, with the structure where the signal charge Q to be discharged is first extracted in the horizontal direction and then to the bottom side of the substrate, the impurity concentration in the n-type well layer can be raised so that a sufficient amount of signal charge Q accumulates at the surface and, at the same time, the resetting operation can be performed at low voltage.

Next, the two-dimensional structure and the circuit structure of the amplifying type solid-state imaging apparatus 100 will be described with reference to FIG. 8. The common drain region 45 indicated by hatching in FIG. 8 is provided so as to encompass pixels such as pixels 41, 42, 43 and 44. A predetermined DC voltage $V_D$ is applied to the common drain region 45. The first gate electrodes 46 are connected in such a manner that the corresponding pixels are all connected in the horizontal direction. For example, the first gate electrodes 46 of adjoining pixels 41 and 42 in FIG. 8 are connected in the horizontal direction, and further connected to a corresponding connection terminal (i) of the first vertical scanning circuit 47. Similarly, the first gate electrodes 46 of adjoining pixels 43 and 44 are connected in the horizontal direction, and further connected to a corresponding connection terminal (i+1) of the first vertical scanning circuit 47. The first vertical scanning circuit 47 successively applies a predetermined voltage to each group of first gate electrodes 46 so that each group of horizontally arranged pixels is selected, thereby performing the read-out operation.

Similar to the first gate electrodes 46, the second gate electrodes 48 are connected in such a manner that the corresponding pixels are all connected in the horizontal direction. For example, the second gate electrodes 48 of the horizontally adjoining pixels 41 and 42 are connected together, and further connected to a corresponding connection terminal (i) of the second vertical scanning circuit 49. Similarly, the second gate electrodes 48 of the horizontally adjoining pixels 43 and 44 are connected together, and further connected to a corresponding connection terminal (i+1) of the second vertical scanning circuit 49. The second vertical scanning circuit 49 successively applies a predetermined voltage to each group of second gate electrodes 48 so that the resetting operation is performed in units of the horizontally arranged pixels. In the resetting operation, the accumulated signal charge is transferred from the surface of the semiconductor substrate to the inside of the substrate.

A source region 50 (cross-hatched portion in FIG. 8) is provided to each pixel substantially in the center of the pixel. The source regions 50 of the pixels arranged in the vertical direction (pixels 41 and 43, for example) are all connected to the signal line 51 which runs in the vertical direction. One end of each signal line 51 is connected to a transistor 52 which is an MOSFET and provides a constant current load. Therefore, each signal line 51 can obtain an output signal from the pixel which is selected by the first vertical scanning circuit 47. The read-out operation performed on a horizontal group of pixels is followed by the resetting operation performed by the second vertical scanning circuit 49 on the same horizontal group of pixels so that the output from each signal line 51 becomes at the resetting level. As described here, the signal level and the resetting level of the selected pixel are alternately obtained through each signal line 51.

The other end of each signal line 51 is connected to a signal line 55 via a clamp capacitor means $C_{CP}$, an MOS transistor 53 serving as a sample hold switch, and an MOS transistor 54 for selecting the signal line. The signal line 55 functions as a video line.

The junction point 56a of the clamp capacitor means $C_{CP}$ and the transistor 53 is connected to an operation voltage source $V_{CP}$ via an MOS transistor 56. The MOS transistor 56 is used as a clamp switch which operates upon application of a predetermined voltage $\Phi_{CP}$, and it is possible to compulsorily supply the junction point 56a with the operation voltage $V_{CP}$. The operation voltage $V_{CP}$ is set in such a manner that an amplifier 58 to be described later satisfies stable amplification operation conditions. The clamp capacitor means $C_{CP}$, the MOS transistor 56 and the operation voltage source $V_{CP}$ constitute a clamp circuit.

A junction point (node) 53a of the MOS transistors 53 and 54 is connected to a sample hold capacitor means $C_{SH}$. A predetermined voltage $\Phi_{SH}$ is applied to the control terminal of the MOS transistor 53, and the MOS transistor 53 performs sample hold switch operation. The MOS transistor 53 and the sample hold capacitor means $C_{SH}$ constitute a sample hold circuit. Moreover, the control terminal of an MOS transistor 54 is connected to a corresponding output end of a horizontal scanning circuit 57. The read-out operation of the sample hold capacitor is performed by successively applying a predetermined voltage $\Phi_H(j)$ to the control terminal of the MOS transistor 54.

Therefore, the signal on the signal line 51 is clamped at the signal level read out from the selected pixel and then sample-held at the resetting level. This makes it possible to hold a difference signal in the sample hold capacitor means $C_{SH}$ between the signal level and the resetting level. By using such difference signal, the threshold voltage which fluctuates from pixel to pixel becomes flattened out, thereby obtaining the substantial amount of the signal. Therefore, the video signal which has extremely small fixed pattern noise arising from the fluctuation of the threshold voltages of pixels can be obtained.

The above-described operation is performed by a controller including the first vertical scanning circuit 47, the second vertical scanning circuit 49, the horizontal scanning circuit 57 and an output control circuit (not shown in the figure) which controls output timing for the predetermined voltage $\Phi_{CP}$ and the predetermined voltage $\Phi_{SH}$. Operations of these components will be described in detail in the following.

First, a pixel signal is clamped at the operation voltage $V_{CP}$ by the clamp circuit. Then, a difference signal between the signal level clamped at the operation voltage $V_{CP}$ and the resetting level (pixel signal voltage with the signal charge Q being extracted) obtained from the source region 50 through the resetting operation described above, that is, a voltage difference between the predetermined voltage and the pixel signal voltage is sample-held. That is, the net (substantial) pixel signal is sample-held at the sample hold circuit through the clamp circuit. This sample hold voltage is successively read out through the signal line 55.

Both the signal level and the resetting level of each pixel reflect a noise due to the fluctuation of the threshold voltage and the amplification factor of the pixel. Therefore, by taking a difference between the signal level and the resetting level which are output from each pixel, the noise inherent in each pixel can be removed, and the net (substantial) pixel signal can be read out accordingly.

Furthermore, an amplifier 58 is provided at the output end of the signal line 55. The amplifier 58 is a feedback amplifier made of an inversion amplifier having sufficiently large gain A (for example 100 or greater), and the input end and the output end of the amplifier are connected to both a feedback capacitor $C_{FB}$ and a resetting MOS transistor 59.

As illustrated in FIG. 8, a parallel circuit 60 including the amplifier 58, the feedback capacitor $C_{FB}$ and the switching means 59 which operates upon application of the predetermined voltage $\Phi_{FB}$ is provided at the output end of the signal line 55. The predetermined voltage $\Phi_{FB}$ is output from a resetting control circuit (not shown in the figure) of the capacitor means $C_{FB}$. By controlling in such a manner that the switch circuit 59 is turned on for a predetermined period of time and then turned off by applying a predetermined voltage $\Phi_{FB}$ immediately before one pixel worth of sample hold voltage is input to the input end of the amplifier 58, the charge stored in the feedback capacitor $C_{FB}$ is reset. Then, a signal component corresponding to one pixel worth of the net pixel signal can be obtained through the amplifier 58 in the parallel circuit 60.

The voltage of the read-out pixel signal is applied to the input side of the clamp capacitor $C_{CP}$. The operation voltage $V_{CP}$ is applied to the output side of the clamp capacitor $C_{CP}$ via the MOS transistor 56, and the same voltage as the operation voltage $V_{CP}$ is compulsorily applied there.

Therefore, there is no need to consider the fluctuation of the reference level of output signal for each pixel. That is, after clamping the pixel signal at the operation voltage $V_{CP}$ of the predetermined voltage, by turning off the MOS transistor 56 and performing resetting operation, a difference signal between the operation voltage $V_{CP}$ and the pixel signal voltage when no signal charge is present, corresponding to the net signal voltage, is obtained. This difference signal can be recorded in the sample hold capacitor $C_{SH}$ through the clamp capacitor $C_{CP}$.

As an example, the case where a signal charge is read out from the pixel 41 will be described. When read-out operation is performed, a signal voltage $V_S$ read out from the selected pixel appears on the signal line 51. Then, the voltage at the junction point 56a between the clamp capacitor $C_{CP}$ and the MOS transistor 53 is the operation voltage $V_{CP}$ compulsorily provided from the operation voltage source via the MOS transistor 56. Then, by performing resetting operation, the voltage on the signal line 51 becomes the resetting voltage which was dropped by net pixel signal voltage $\Delta V_S$. Similarly, since the voltage also drops by net signal voltage $\Delta V_S$ at the output side of the clamp capacitor $C_{CP}$, a difference signal $(V_{CP}-\Delta V_S)$ as the clamp voltage is obtained accordingly. This clamp voltage $V_{CP}-\Delta V_S$ is sample-held by the sample hold capacitor $C_{SH}$. For this sample hold voltage which is the difference signal $V_{CP}-\Delta V_S$, since the effect of the fluctuating threshold voltage or amplification factor for each pixel is flattened out, the voltage corresponding only to the net signal voltage $\Delta V_S$ can be obtained. Therefore, a video signal having an extremely small amount of the fixed pattern noise is obtained.

The sample hold voltage $V_{CP}-\Delta V_S$ which is recorded in the sample hold capacitor $C_{SH}$ is successively selected in the horizontal direction via the MOS transistor 54 functioning as a horizontal selection switch which is driven by the horizontal scanning circuit 57, and read out on the horizontal signal line 55. Since the horizontal signal line 55 itself is sufficiently long, the stray capacitance $C_S$ of the horizontal signal line 55 is too large to be ignored compared to the sample hold capacitor $C_{SH}$. As a result, if the net signal voltage recorded in the sample hold capacitor $C_{SH}$ is designated by $V_{eff}$, the signal voltage $V_{line}$ read out to the horizontal signal line 55 becomes $$V_{line}=V_{eff} \cdot C_{SH}/(C_{SH}+C_S),$$

which is smaller than the net signal voltage $V_{eff}$. For this reason, a technique described next is used.

Figure 10:
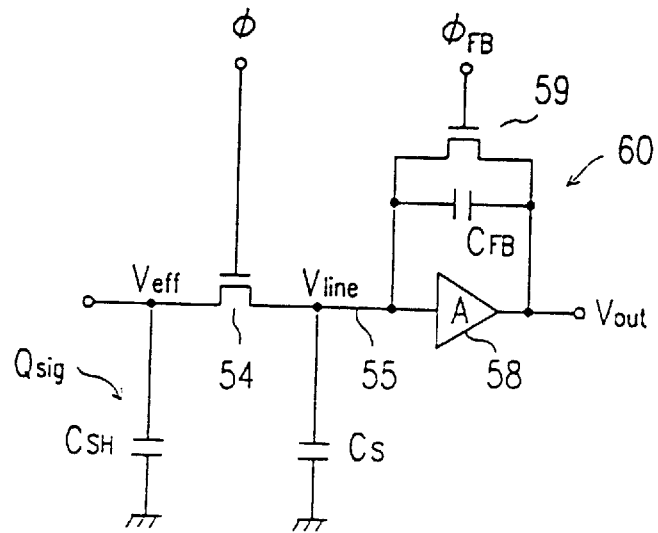
FIG. 10 is a circuit diagram of the parallel circuit provided from a sample hold means of the present invention via a signal line.
Figure 11:
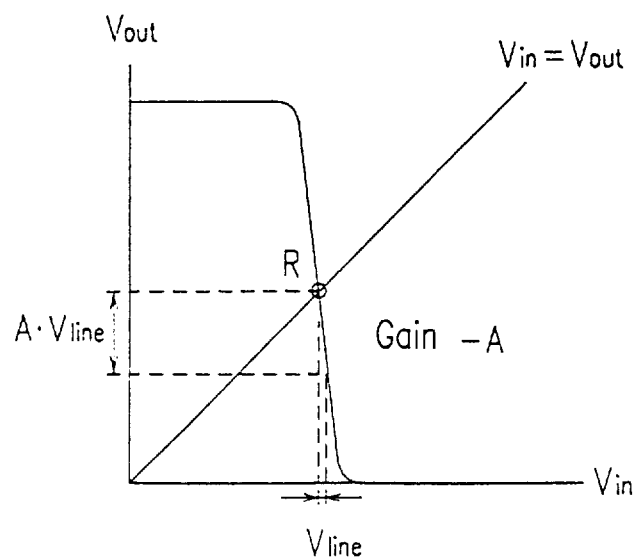
FIG. 11 is a graph illustrating a relationship between the input voltage $V_{in}$ and the output voltage $V_{out}$ of the amplifying means in FIG. 8.

FIG. 10 is a circuit diagram illustrating the structure of the above-described parallel circuit 60, where $C_S$ represents the parasitic capacitance. As described above, the feedback amplifier 58 provided at the output end of the horizontal signal line 55 is the inversion amplifier having sufficiently large gain A (for example A=100 or greater). As illustrated in FIG. 10, the input end and the output end of the amplifier 58 are connected to the feedback capacitor $C_{FB}$ and the resetting MOS transistor 59 which are connected in parallel. By applying the pulse voltage $\phi_{FB}$ to the MOS transistor 59, the output end and the input end of the amplifier 58 are shorted. When this is being done, the input voltage $V_{in}$ and the output voltage $V_{out}$ of the amplifier 58 are represented by the operation point R in (resetting operation) in FIG. 11 where a relationship $V_{in}=V_{out}$ is satisfied.

Next, if the selected MOS transistor 54 is turned on, as illustrated in FIG. 10, the signal charge $Q_{sig}=V_{eff} \cdot C_{SH}$ held in the corresponding sample hold capacitor $C_{SH}$ is read out to the horizontal signal line 55 and becomes the signal voltage $V_{line}$ on the horizontal signal line 55. At the same time, the feedback capacitor $C_{FB}$ is charged at the voltage difference between the output signal OS (output voltage $V_{out}=A \cdot V_{line}$) obtained by amplifying the signal voltage $V_{line}$ with gain A.

From the above relationship, the output voltage $V_{out}$ becomes $$V_{out}=V_{eff} \cdot C_{SH}/[C_{FB}+(C_{SH}+C_S)/A].$$

From this equation, it can be seen that if gain A is sufficiently large, then the effect of the stray capacitance $C_S$ is inhibited. Alternatively, by setting the feedback capacitance $C_{FB}$ to be smaller than the sample hold capacitance $C_{SH}$, it is also possible to set the output voltage $V_{out}$ to be larger than the net signal voltage $V_{eff}$.

The output voltage $V_{out}$ can be obtained from the following equation (2). In equation (2), $V_{line}$ is shown as $V_{in}$.

$$\begin{aligned}
Q_{sig} &= C_{SH} \cdot V_{eff} \quad (2)\\
&= (C_{SH}+CS)V_{in}+C_{FB}AV_{in}\\
&= (C_{SH}+C_S+AC_{FB})V_{in}\\
&= \left(\frac{C_{SH}+C_S}{A}+C_{FB}\right)V_{out}\\
\therefore V_{out} &= \frac{Q_{sig}}{C_{FB}+\frac{C_{SH}+C_S}{A}}\\
&= \frac{C_{SH}}{C_{FB}+\frac{C_{SH}+C_S}{A}} V_{eff}
\end{aligned}$$

Figure 12:
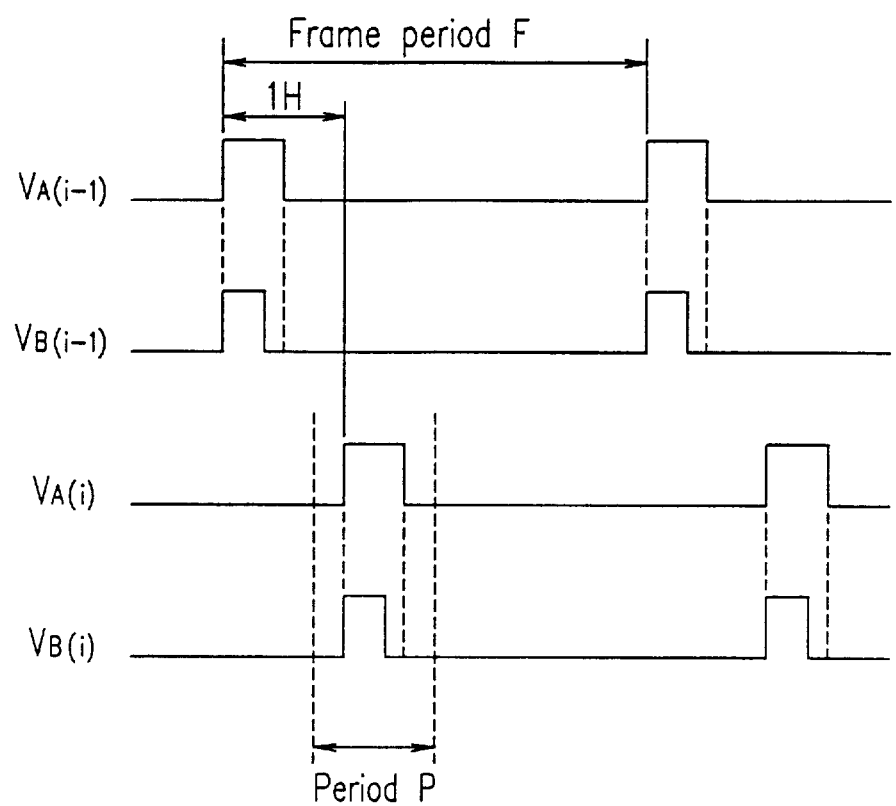
FIG. 12 is a timing chart when the amplifying type solid-state imaging apparatus of FIG. 8 is driven.
Figure 13:
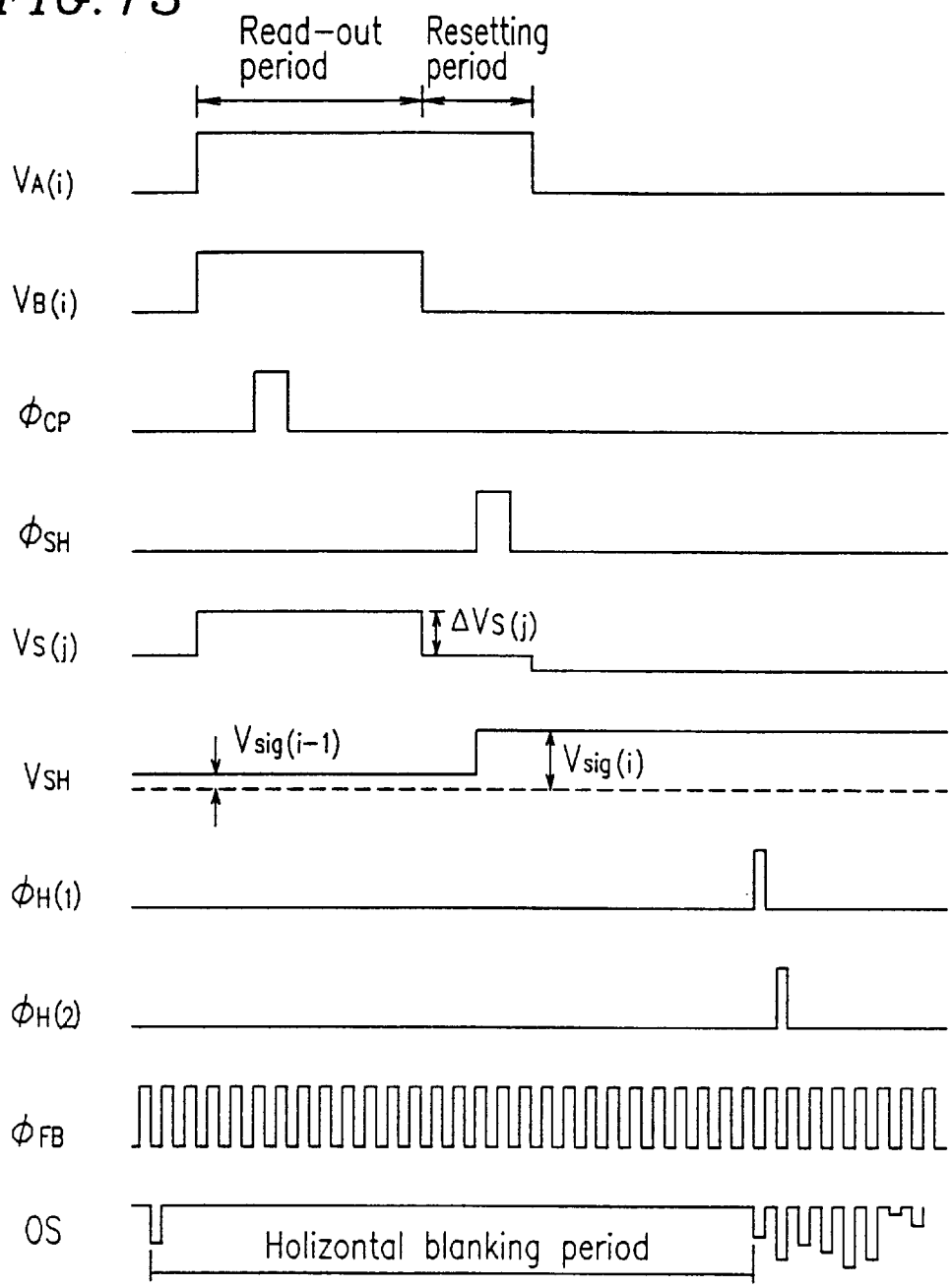
FIG. 13 is a timing chart magnifying and illustrating in detail the period P shown in FIG. 12.

FIG. 12 is a timing chart when the two-dimensional amplifying type solid-state imaging apparatus 100 of FIG. 8 is driven. FIG. 13 is a timing chart magnifying and illustrating in detail the period P shown in FIG. 12. As illustrated in FIG. 12, each scanning line (read-out scanning line and corresponding resetting scanning line) is scanned once for every one frame period F. A period between a time when one scanning line (i) is scanned and a time when next scanning line (i+1) is scanned is called a horizontal scanning period H. During the horizontal scanning period H, video signals are read out from a group of pixels connected to one scan line. Moreover, in FIG. 13, a horizontal blanking period refers to a period between a time when the output of video signals (output signal OS) read out from a group of pixels corresponding to one scanning line is finished and a time when the output of video signals read out from a group of pixels corresponding to another scanning line is started.

A read-out scanning voltage $V_A(i)$ is a voltage to be applied to an i-th clock line in the vertical direction of the first gate electrodes (photo gate) 46, and resetting scanning voltage $V_B(i)$ is a voltage to be applied to an i-th clock line in the vertical direction of the second gate electrodes (resetting gate) 48.

As illustrated in FIGS. 12 and 13, by setting the read-out scanning voltage $V_A(i)$ to be applied to the first gate electrodes of the i-th group of horizontally arranged pixels at high level, and by setting the readout scanning voltage $V_A(k)$ ($k \neq i$) to be applied to the first gate electrodes 46 of other groups of horizontally arranged pixels at low level, a signal voltage $V_S(j)$ of the corresponding i-th pixel is read out to each signal line 51. As illustrated in FIG. 13, a period when both the read-out scanning voltage $V_A$ and the resetting scanning voltage $V_B$ are at high level is referred to as a read-out period.

Hereinafter, description will be given with reference to one pixel (pixel 41 in FIG. 8, for example). Operations described in the following is the same for each of the pixels of the i-th group. During the read-out period, by driving the MOS transistor 56 by the pulse voltage $\phi_{CP}$, the operation voltage $V_{CP}$ is given to the clamp capacitor $C_{CP}$ through the node 56a. Accordingly, the voltage on the node 56a is clamped at the operation voltage $V_{CP}$ regardless of the read-out pixel signal voltage $V_S(j)$ (not shown in FIG. 13). The pixel selected by the horizontal scanning circuit 57 is considered to be the j-th pixel.

The resetting operation is performed by setting the resetting scanning voltage $V_B(i)$ to be applied to the second gate electrode 48 of the i-th pixel at low level while at the same time maintaining the scanning voltage $V_A(i)$ to be applied to the first electrode 46 of the i-th pixel at high level. Because of this resetting operation, the j-th signal line 51 comes to at the resetting level (resetting voltage $V_{SD}$ after the voltage drop) Therefore, as illustrated in FIG. 13, the net signal voltage $\Delta V_S$ is obtained as a voltage difference of the voltages $V_S(j)$ of the pixel signal on the signal line 51 before and after the resetting operation (i.e., signal voltage $\Delta V_S$= operation voltage $V_{CP}$–resetting voltage $V_{SD}$).

During the resetting operation, since the node 56a is in a floating condition, a charge corresponding to the operation voltage $V_{CP}$ is held as it is to the node 56a side. Then, while the read-out scanning voltage $V_A(i)$ is continuously maintained at high level, the MOS transistor 53 is driven with the pulse voltage $\phi_{SH}$. For this reason, the above-described net signal voltage $\Delta V_S$ (i.e., a difference between the operation voltage $V_{CP}$ and the resetting voltage $V_{SD}$) is obtained from the clamp capacitor $C_{CP}$. The net signal voltage $\Delta V_S$ is applied to the sample hold capacitor $C_{SH}$ via the node 53a. As a result, as illustrated in FIG. 13, a signal voltage $V_{sig}(i)$ corresponding to the net signal voltage $\Delta V_S$ is held in the sample hold capacitor $C_{SH}$. A period when the read-out scanning signal $V_A$ is at high level and the resetting scanning signal $V_B$ is at low level is referred to as a resetting period.

The sample hold signal voltage $V_{SH}$ held in the sample hold capacitor $C_{SH}$ is successively read out for every one horizontal scanning period according to the selection operation for pixels by the horizontal scanning circuit 57. That is, the signal voltage $V_{sig}(i)$ of the i-th group of pixels currently held in each sample hold capacitor $C_{SH}$ is successively selected by the pulse voltages $\phi_H(1), \phi_H(2), \ldots \phi_H(j), \ldots$ and read out to the output line 55.

The signal read out to the output line 55 is amplified by the parallel circuit 60 including the amplifier 58 and is output from the output terminal OS. A feedback amplifier resetting pulse $\phi_{FB}$ is applied to the resetting MOS transistor 59 of the parallel circuit 60 at the pixel signal cycle in such a manner that it does not overlap with the pulse voltage $\phi_H(j)$. Because of this, the signal voltage $V_{sig}(j)$ corresponding to the net signal voltage $\Delta V_S$ reset for every one pixel is successively read out to the output line 55 and is amplified by the parallel circuit 60, and then sent to the output terminal OS.

Figure 14:
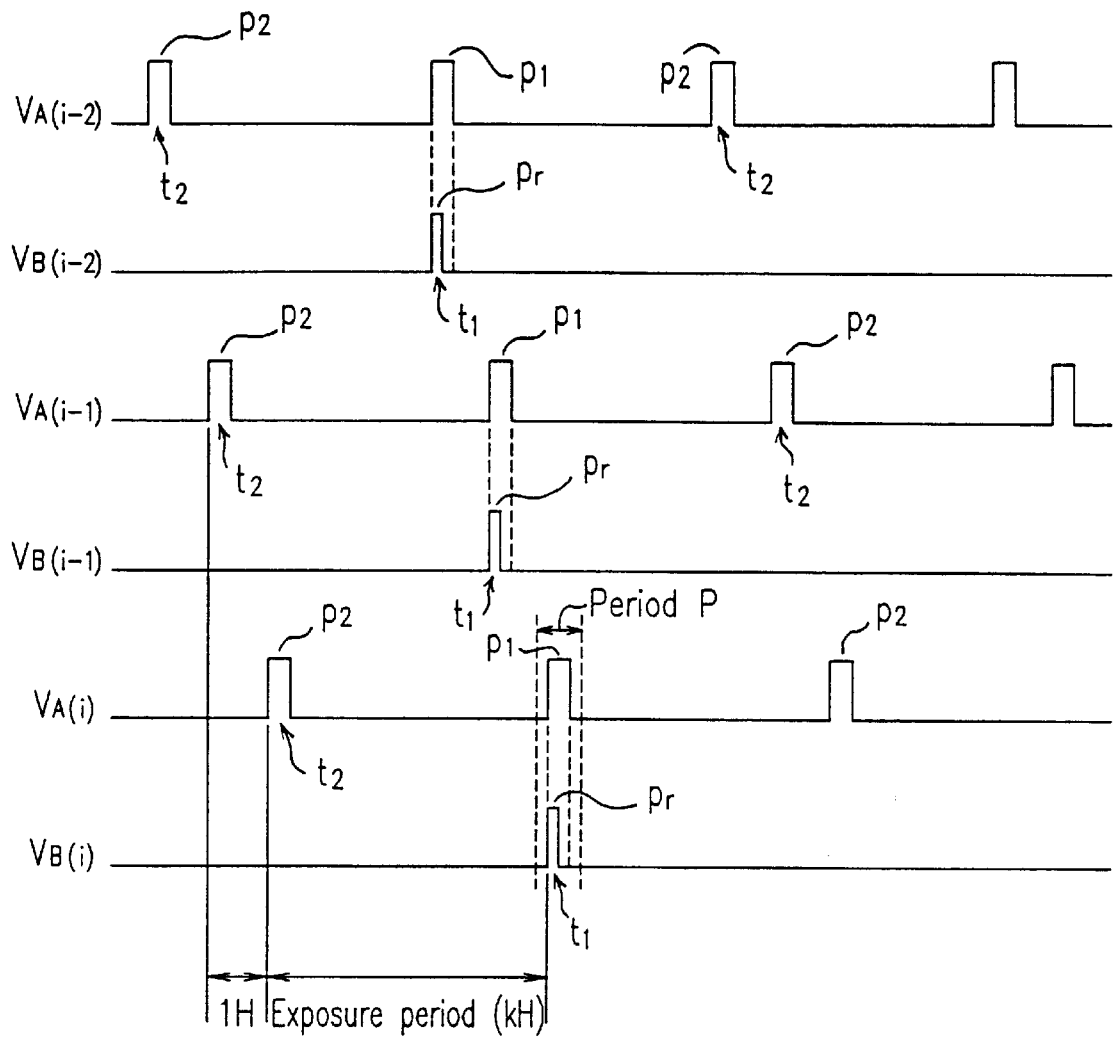
FIG. 14 is another timing chart for driving the amplifying type solid-state imaging apparatus of FIG. 8.
Figure 15:
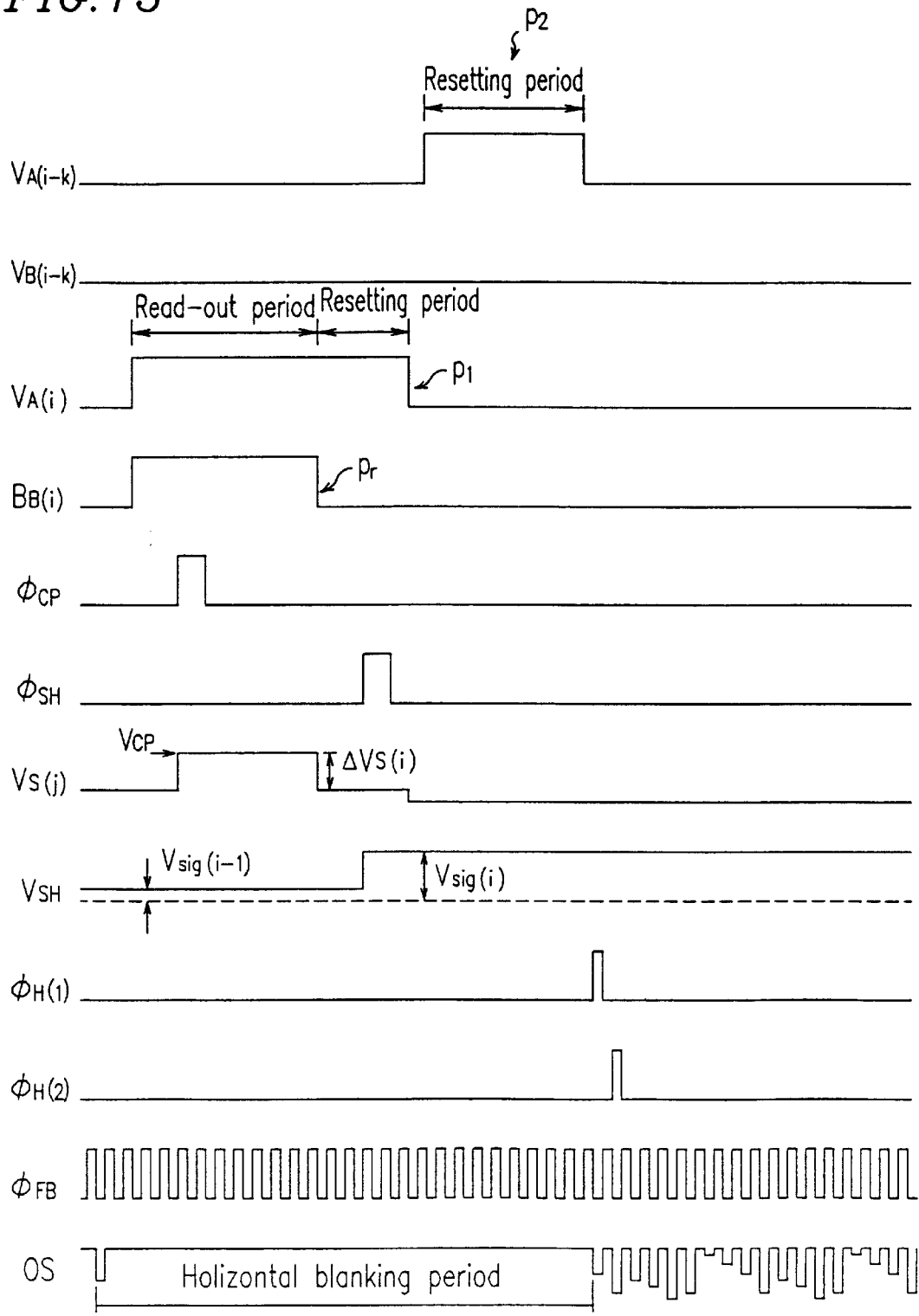
FIG. 15 is a timing chart magnifying and illustrating in detail the period P shown in FIG. 14.

FIG. 14 is another timing chart for driving the two-dimensional amplifying type solid-state imaging apparatus 100 of Embodiment 1. FIG. 15 is a timing chart magnifying and illustrating in detail the period P shown in FIG. 14. Names and its meanings of pulse signals remain the same as in FIGS. 12 and 13.

FIGS. 14 and 15 illustrate shuttering operation where the exposure period is reduced to an arbitrary exposure period kH by bringing the resetting timing closer to the read-out operation. By setting the exposure period kH in accordance with the brightness (one frame period at maximum), an optimum image in accordance with the brightness can be obtained. For example, in a situation where it is extremely bright, by increasing the shutter speed, excessive exposure to light as well as the halation and the like can be prevented.

As already described with reference to FIG. 12, typically, a signal accumulation period for each pixel equals a period from a time when the pixel is scanned for once to read out the video signal to a time when the next scan is performed, i.e., substantially to one frame period.

As illustrated in FIG. 14, in one frame period, the read-out scanning signal $V_A$ and the resetting scanning signal $V_B$ include a read-out pulse $p_1$ and a first resetting pulse $p_r$, respectively, at a pulse position $t_1$ of an ordinary read-out operation and a resetting operation (regarded as the first resetting operation). For this reason, as in the case of FIG. 12, a read-out period and a resetting period (regarded as a first resetting period) are provided. Furthermore, by applying a pulse $p_2$ (regarded as a second resetting pulse) to the read-out scanning signal $V_A$ also at the pulse position $t_2$ before the ordinary pulse position $t_1$, a second resetting period is provided (this operation is referred to as the second resetting operation). The first and second resetting periods are both a period when the read-out scanning signal $V_A$ is at high level and the corresponding resetting scanning signal $V_B$ is at low level.

Since a charge accumulated in each pixel is extracted in the second resetting operation, the charge accumulation period of that pixel (i.e., the exposure period kH) becomes a period from the second resetting operation to the next read-out operation. As described, by providing the second resetting pulse $p_2$ in the read-out scanning signal $V_A$, the exposure period for each pixel can be made equal to the exposure period kH which is shorter than one frame period. The exposure period kH can be set arbitrarily by selecting the position $t_2$ of the second resetting pulse $p_2$. Moreover, in each pixel, since a charge accumulated during a period from one read-out operation to the second resetting operation does not contribute to a video signal to be read out next from the same pixel, it is equivalent to the shutter of the solid-state imaging apparatus being shut during a period from the read-out operation to the second resetting operation. In this manner, shutter operation which reduces the exposure period to the exposure period kH can be realized.

Here, the timing for the read-out operation and the second resetting operation will be described. As illustrated in FIG. 15, when a pixel signal is read out from the i-th pixel in the vertical direction during one horizontal blanking period, the second resetting pulse $p_2$ is applied to the (i–k)-th pixel (k≧1) in the vertical direction during the following horizontal scanning period.

FIG. 14 illustrates the timing for the read-out pulse $p_1$, the first resetting pulse $p_r$ and the second resetting pulse $p_2$. As can be seen from FIG. 14, the timing for these pulses is set in such a manner that pulses to be applied to different horizontal groups of pixels do not overlap so that signal read-out from each horizontal group of pixels does not interfere.

As described above, the TGMIS type amplifying type solid-state imaging apparatus 100 according to Embodiment 1 has transistors formed on the surface side of the semiconductor substrate 61, each of which is made of the source region 50, the drain region 45 and the first gate region corresponding to the first gate electrode 46. Each transistor corresponds to one pixel (such as 41). A signal charge generated by incident light to each transistor is accumulated at the surface of the semiconductor substrate inside the transistor, and an electrical signal corresponding to the accumulated signal charge is output from the source region 50.

Moreover, the second gate region provided adjacent to the transistor includes a part of the semiconductor substrate 61, the insulating film 63 formed on a part of the semiconductor substrate 61 and the second gate electrode 48 provided on the insulating film 63. Due to a voltage (resetting pulse) applied to the second gate electrode 48, the accumulated signal charge is extracted from the surface to the inside of the semiconductor substrate 61 (resetting operation).

The video signal read out from each pixel is clamped at the operation voltage $V_{CP}$ by the clamp circuit (clamp capacitor $C_{CP}$ and MOS transistor 56) regardless of its read-out voltage. By performing the resetting operation, the accumulated signal charge is extracted, and the voltage on the signal line 51 drops by the voltage difference $\Delta V_S$ corresponding to the extracted signal charge (i.e., pixel signal). This voltage difference $\Delta V_S$ manifests as a difference between the operation voltage $V_C$ and the resetting voltage $V_{SD}$, is held in the sample hold capacitor $C_{SH}$ of the sample hold circuit, and is read out in accordance with the horizontal scanning. Therefore, the signal voltage corresponding to the net pixel signal voltage whose fluctuation of offset levels due to differences in the threshold voltage and the amplification factor for each pixel is flattened out is read out, and a fixed pattern noise due to the fluctuation of characteristics from pixel to pixel can be considerably reduced.

The amplifying circuit 58 is provided between the sample hold circuit and the output terminal OS. The parallel circuit 60 of the capacitor $C_{FB}$ and the switching device 59 is provided between the input end and the output end of the amplifying circuit 58. The resetting operation is performed by turning the switching device 59 on for a predetermined time and then turning off immediately before one pixel worth of signal reaches the input end of the amplifying circuit 58. As a result, it becomes possible to reset the charge on the capacitor $C_{FB}$ for every read-out operation for one pixel worth of signal, and to inhibit the influence of the stray capacitance associated with the output side of the sample hold means.

In Embodiment 1, the TGMIS type pixel such as the one shown in FIG. 9 is incorporated in the structure of the pixel, and transistors formed on the surface of the semiconductor substrate 61 are MOS FETs. However, the embodiment of the present invention is not limited thereto. For example, like a pixel 41' illustrated in FIG. 16, the transistor in each of the pixels can be a junction gate type FET. Alternatively, like a pixel 41" illustrated in FIG. 17, the transistor in each of the pixels can be an FET with a control gate.

Figure 16:
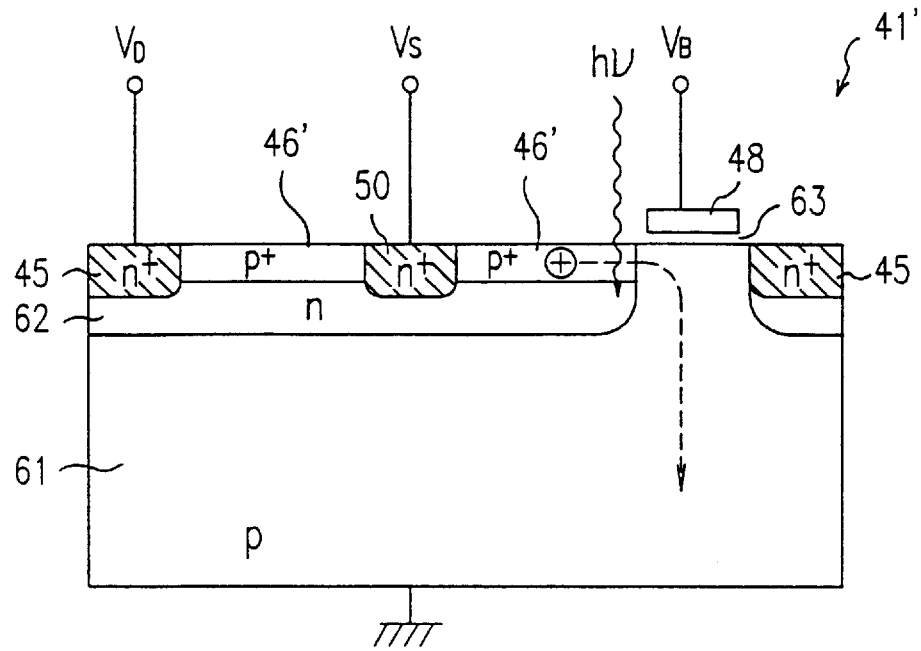
FIG. 16 is a cross-sectional view of a pixel having a junction gate type FET.
Figure 17:
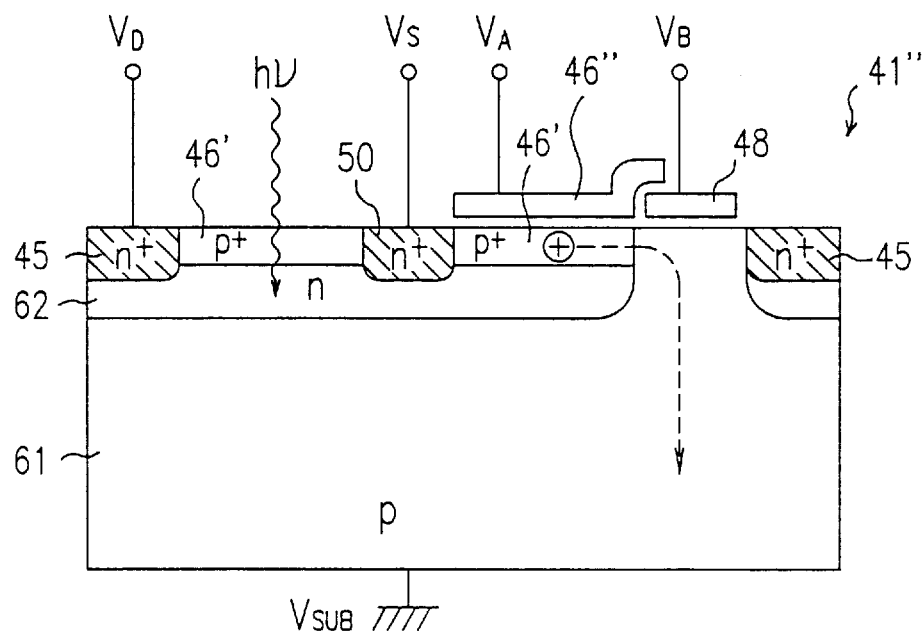
FIG. 17 is a cross-sectional view of a pixel having an FET with a control gate.
Figure 18:
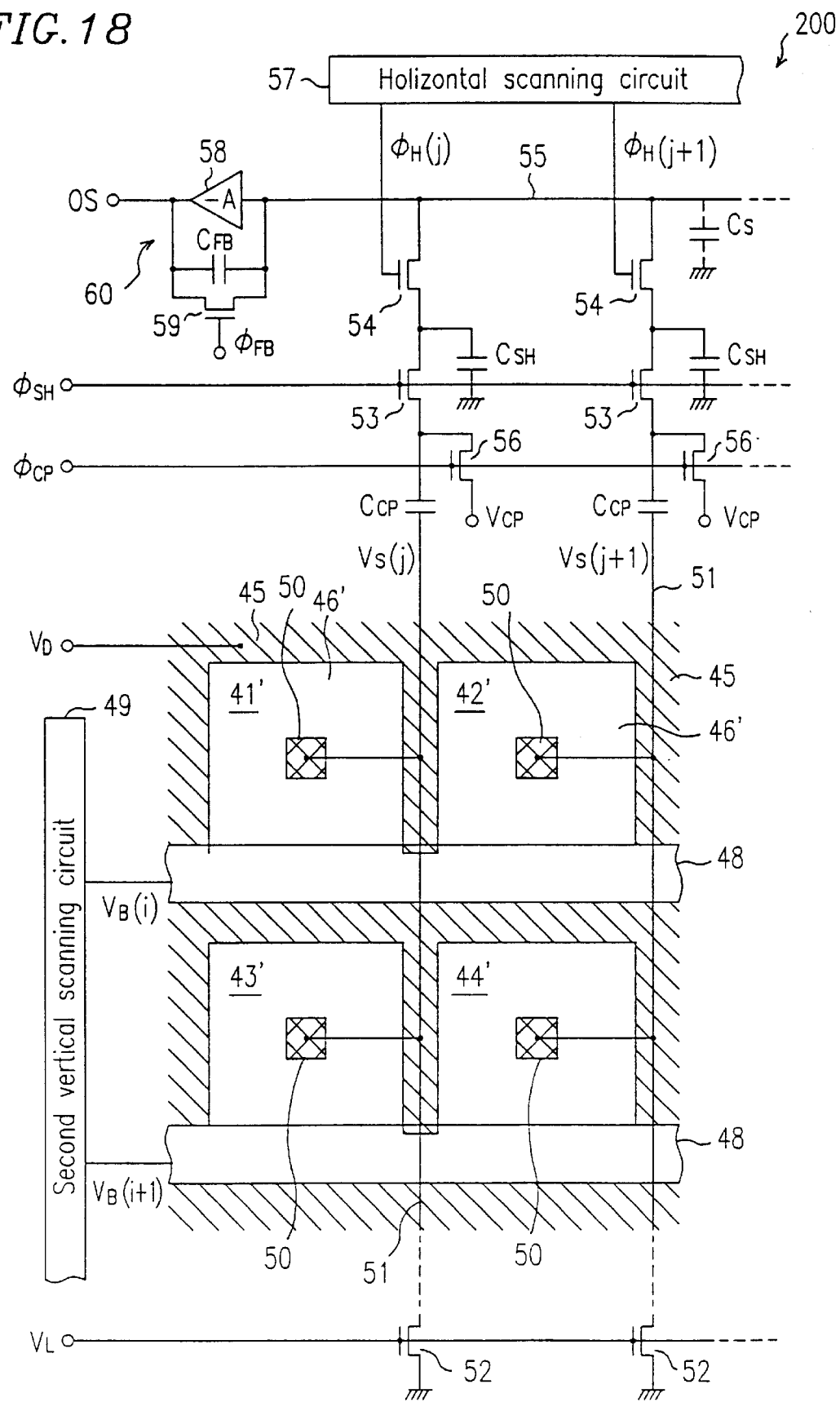
FIG. 18 schematically illustrates the construction of a two-dimensional amplifying type solid-state imaging apparatus utilizing the pixels shown in FIG. 16.
Figure 19:
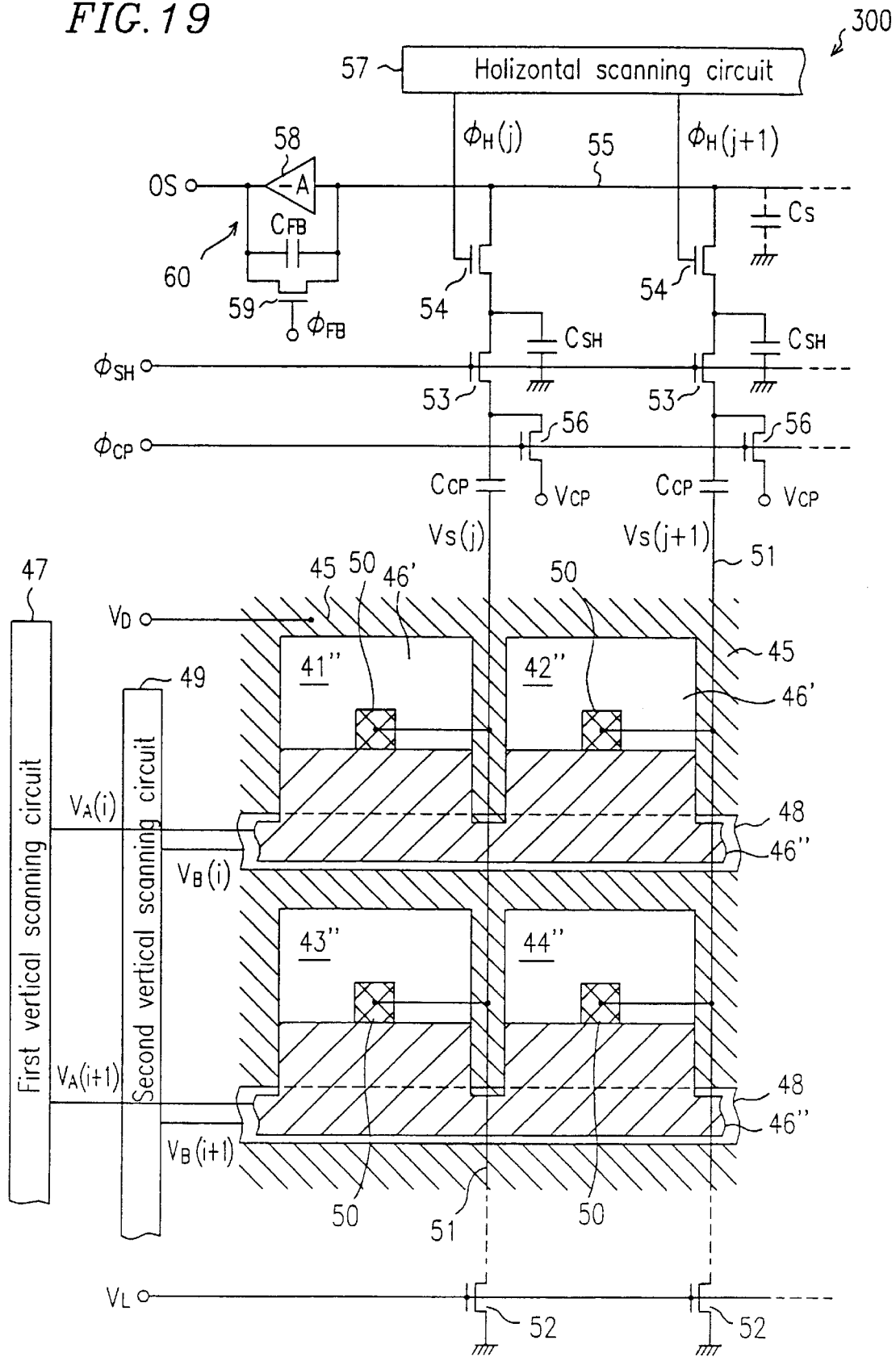
FIG. 19 schematically illustrates the construction of a two-dimensional amplifying type solid-state imaging apparatus utilizing the pixels shown in FIG. 17.

FIG. 18 schematically illustrates the structure of a two-dimensional amplifying type solid-state imaging apparatus 200 including the pixels 41' shown in FIG. 16 according to the present invention as a combination of a plan view of the pixels and a circuit diagram. Similarly, FIG. 19 schematically illustrates the structure of a two-dimensional amplifying type solid-state imaging apparatus 300 including the pixels 41" shown in FIG. 17 according to the present invention as a combination of a plan view of the pixels and a circuit diagram. In FIGS. 17 and 18, the same constituent elements as in the two-dimensional solid-state imaging apparatus 100 are designated by the same reference numerals, and the detailed descriptions thereof are omitted. Although the pixels 41' and 41" are constructed differently, each operation of the two-dimensional amplifying type solid-state imaging apparatuses 200 and 300, i.e., the read-out operation of a pixel signal from the pixel, the clamp operation, the sample hold operation, the amplifying readout operation, and the like are the same as in the case of the two-dimensional amplifying type solid-state imaging apparatus 100.

Figure 20:
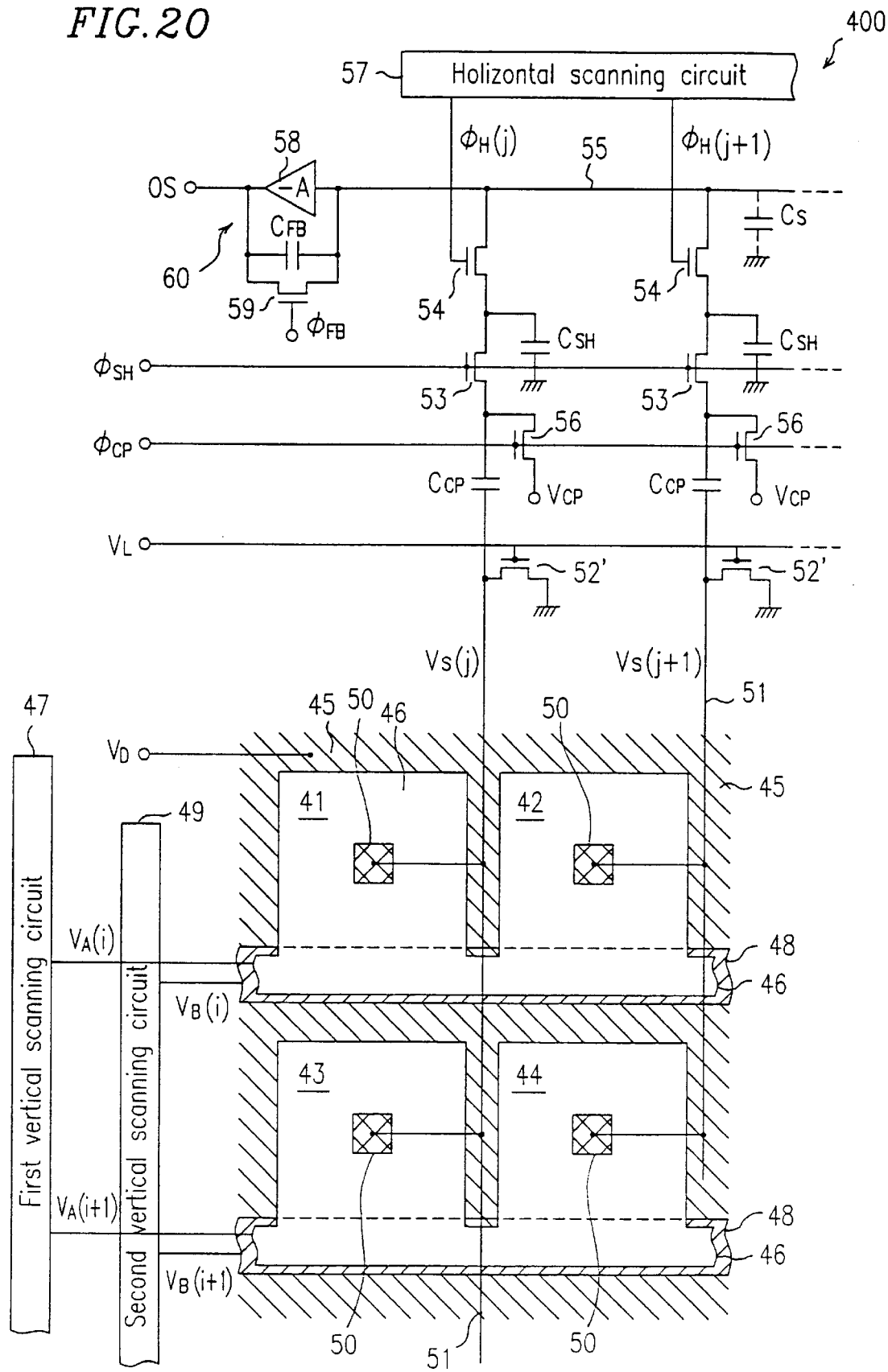
FIG. 20 schematically illustrates the construction of a modification of the amplifying type solid-state imaging apparatus of FIGS. 1A and 1B.

As illustrated in FIG. 8, the two-dimensional amplifying type solid-state imaging apparatus 100 has the load MOS transistors 52 on the opposite side of the pixels from the clamp circuit (the clamp capacitor $C_{CP}$ and the MOS transistor 56) and the sample hold circuit (the sample hold capacitor $C_{SH}$ and the MOS transistor 53). However, the present invention is not limited to this arrangement. For example, as in a two-dimensional amplifying type solid-state imaging apparatus 400 illustrated in FIG. 20, it is possible to dispose load MOS transistors 52' on the same side as the clamp circuit (the clamp capacitor $C_{CP}$ and the MOS transistor 56) and the sample hold circuit (the sample hold capacitor $C_{SH}$ and the MOS transistor 53).

(Embodiment 2)

Figure 21:
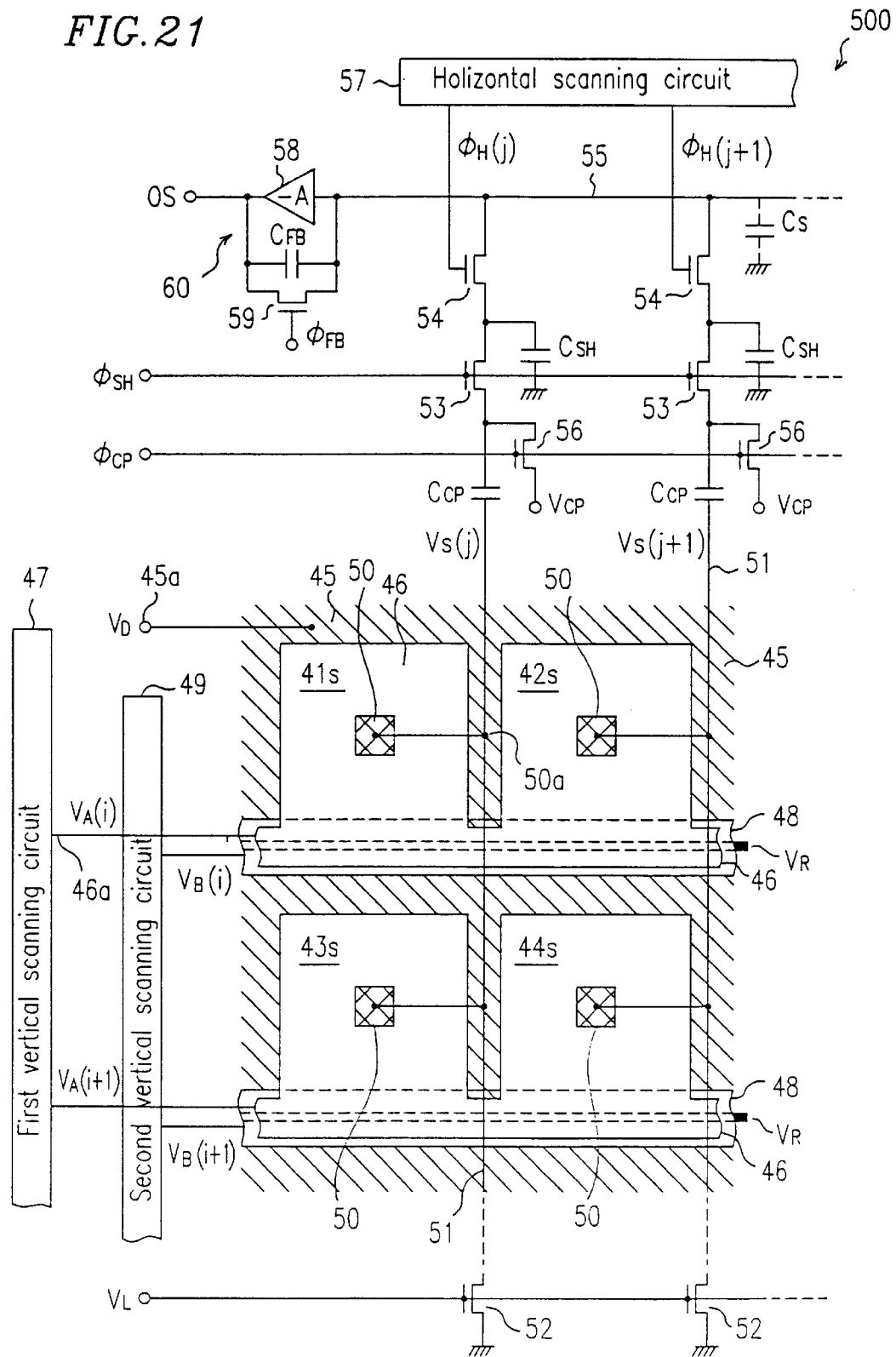
FIG. 21 schematically illustrates an amplifying type solid-state imaging apparatus according to Embodiment 2 of the present invention.

FIG. 21 schematically illustrates an amplifying type solid-state imaging apparatus 500 according to Embodiment 2 of the present invention. The amplifying type solid-state imaging apparatus 500 according to Embodiment 2 differs from the amplifying type solid-state imaging apparatuses 100 to 400 according to the above-described Embodiment 1. That is, the TGMIS type pixels are used in Embodiment 1 so that the signal charge is extracted toward the inside of the substrate 61. However, a surface resetting type pixel 41s is used in Embodiment 2.

Figure 22:
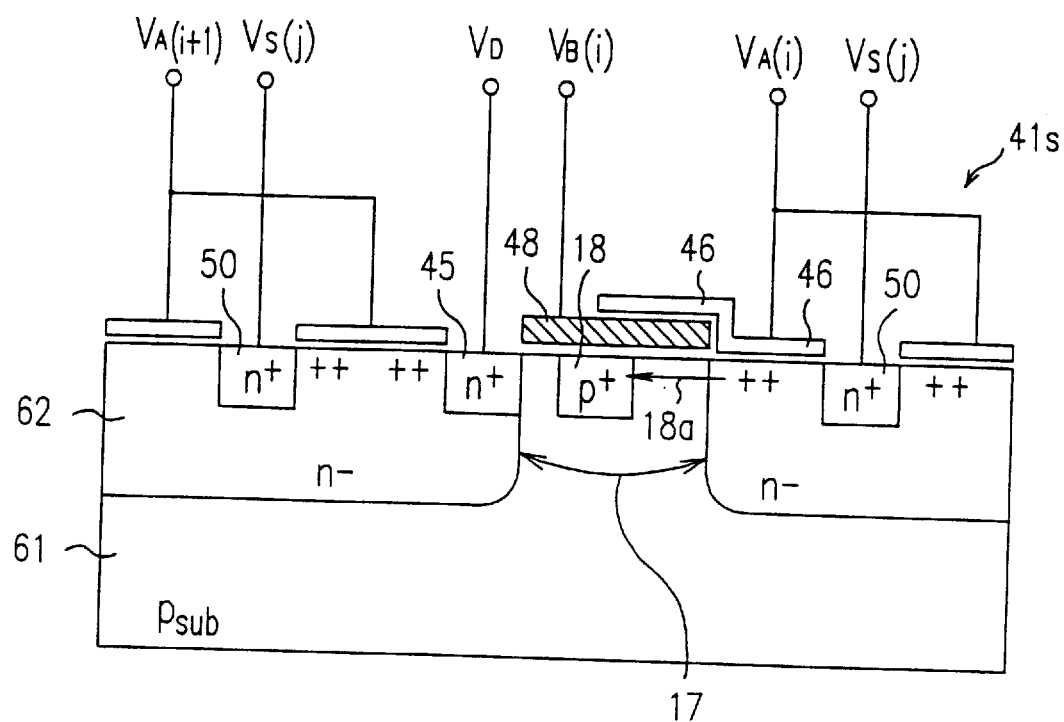
FIG. 22 is a cross-sectional view of a surface resetting type pixel.

The pixel 41s illustrated in FIG. 22 has the structure which is an improved version of the above-described TGMIS type structure. The structure of the pixel 41s is disclosed in Japanese Patent Application No. 8-19199 (S96231:...) by the present inventors. The disclosure of the above U.S. Patent Application is herein incorporated for reference. As in the pixel 41s illustrated in FIG. 22, an n-type semiconductor well layer 62 is formed on a p-type semiconductor substrate 61. A first gate electrode 46 is formed on the n-type semiconductor well layer 62, and a second gate electrode 48 is formed on the above-mentioned p-type semiconductor substrate 61 in such a manner that the edge of the second gate electrode 48 is on the boundary between the p-type semiconductor substrate 61 and the n-type semiconductor well layer 62. The potential barrier due to the second gate electrode 48 is formed in a region of the p-type semiconductor substrate 61 interposed between the n-type semiconductor well layers 62. A p-type low-resistance surface resetting drain 18 is formed on a portion of the surface of the p-type semiconductor substrate 61 under the second gate electrode 48. A source region 50 and a drain region 45 are formed with an n⁺-type diffusion layer, and an MOS transistor is formed with the first gate electrode 46 as a gate.

In the above-described structure, a photon having the energy hv and entering through the first gate electrode 46 creates an electron-hole pair due to photoelectric conversion in a photoelectric conversion region of the n-type semiconductor well layer 62. The electron thus created flows to the drain region. The hole, on the other hand, is confined by the potential barrier formed in the middle of the n-type semiconductor well layer 62 and by the potential barrier formed under the second gate electrode 48, and the holes accumulate as a signal charge at the interface in the first gate region between the semiconductor and the insulating film as a signal charge. A change in the potential within the n-type semiconductor well layer 62 in accordance with an amount of this signal charge is read out as a voltage change at the source 50, and is regarded as an output signal. As described here, the MOS transistor in each pixel functions as a photosensor which outputs an electrical signal in accordance with the radiated light.

By lowering the potential barrier under the second gate electrode 48, the accumulated signal charge flows to the low-resistance surface resetting drain 18 along the path 18a illustrated in FIG. 22, and is readily discharged. By discharging the charge through such path 18a, the accumulated charge is completely discharged without the influence of the ridge 17 of the potential formed in the p-type semiconductor substrate 61 under the second gate electrode, and the resetting operation can successfully be finished. The details on the ridge 17 of the potential is given in the above-described prior applications.

The structure of the amplifying type solid-state imaging apparatus 500 other than the pixels is similar to the amplifying type solid-state imaging apparatus 100 described in Embodiment 1, and the corresponding parts of the amplifying type solid-state imaging apparatus 500 are designated by the same reference numerals.

Since the amplifying type solid-state imaging apparatus 500 of Embodiment 2 can be operated by the same drive timing (i.e., read-out operation of a pixel signal from each pixel, clamp operation, sample hold capacitor, amplification and read-out operation, etc.) as the amplifying type solid-state imaging apparatus of Embodiment 1, a similar effect can be obtained.

(Embodiment 3)

Figure 23:
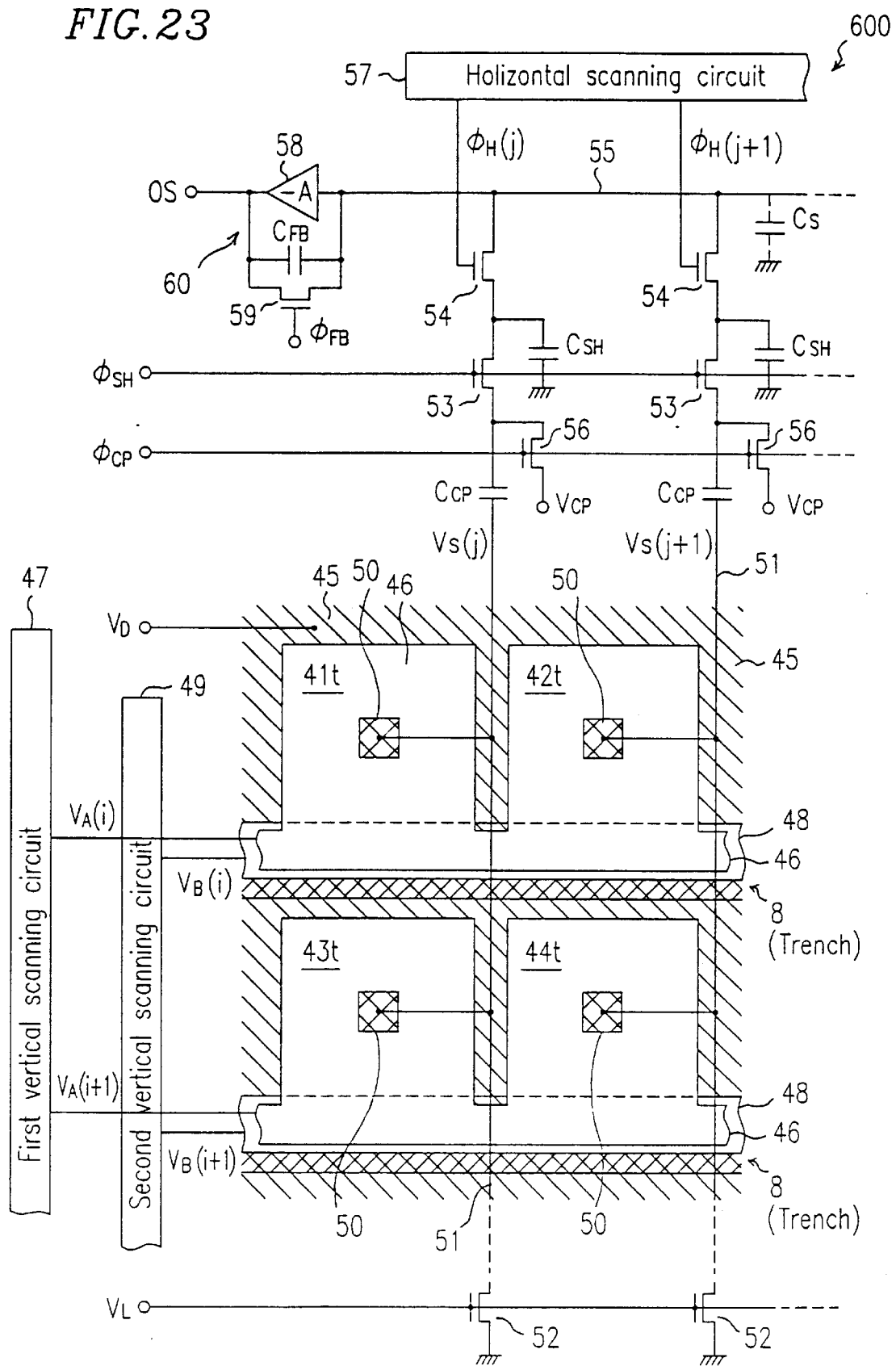
FIG. 23 schematically illustrates an amplifying type solid-state imaging apparatus according to Embodiment 3 of the present invention.

FIG. 23 schematically illustrates an amplifying type solid-state imaging apparatus 600 according to Embodiment 3 of the present invention. The structure of the pixel of the amplifying type solid-state imaging apparatus 600 according to Embodiment 3 differs from that of the amplifying type solid-state imaging apparatuses 100 to 500 according to Embodiments 1 and 2. That is, a trench type pixel 41t illustrated in FIG. 24 is used in Embodiment 3.

Figure 24:
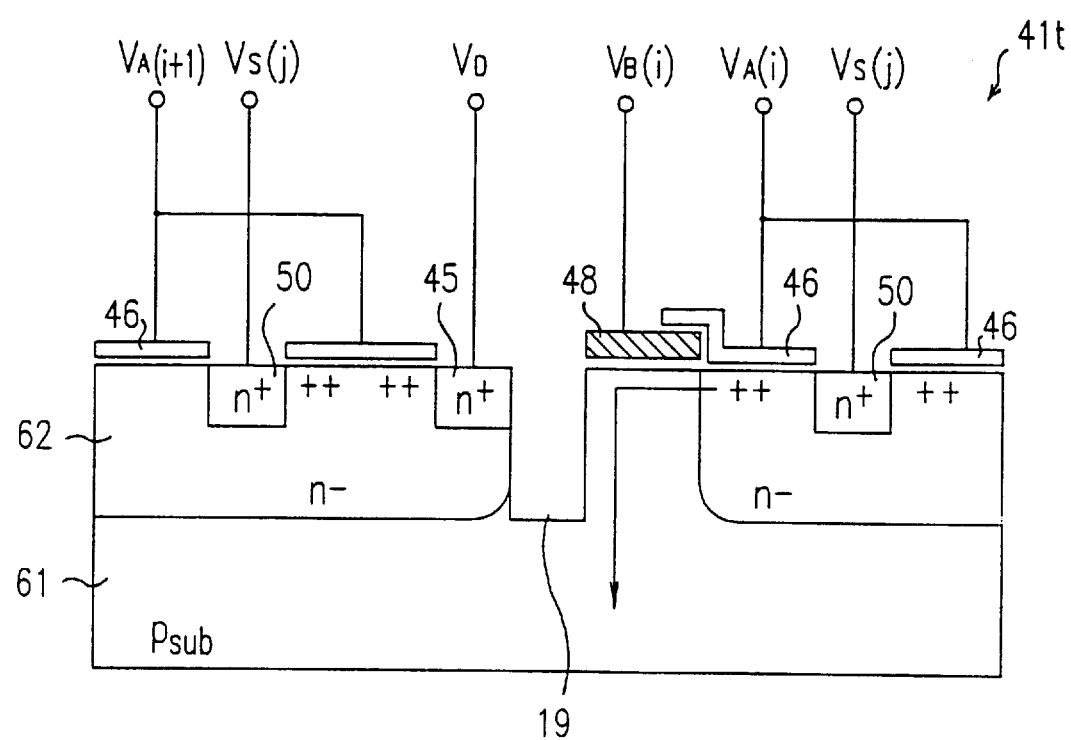
FIG. 24 is a cross-sectional view of a trench type pixel.

The pixel 41t illustrated in FIG. 24 has a structure obtained by improving the above-mentioned TGMIS type pixel from a different view point, and is disclosed by the present applicant in Japanese Patent Application No. 8-19200.

In the pixel 41t illustrated in FIG. 24, an n-type semiconductor well layer 62 is formed on the p-type semiconductor substrate 61, and a first gate electrode 46 is formed on the n-type semiconductor well layer 62. A second gate electrode 48 is formed on the p-type semiconductor substrate 61 in such a manner that the edge of the second gate electrode 48 is on the boundary between the n-type semiconductor well layer 62 and the p-type semiconductor substrate 61. A source region 50 and a drain region 45 are formed with an n⁺-type diffusion layer, and an MOS transistor is formed with the first gate electrode 46 as a gate.

Figure 1A:
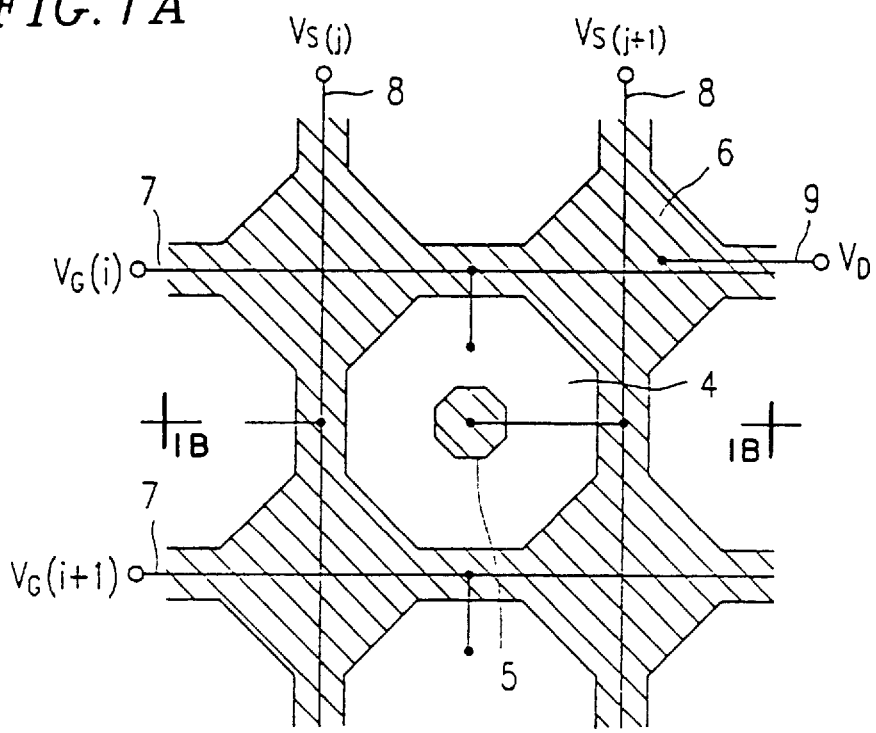
FIG. 1A is a plan view of a CMD type pixel in a conventional amplifying type solid-state imaging apparatus.
Figure 1B:
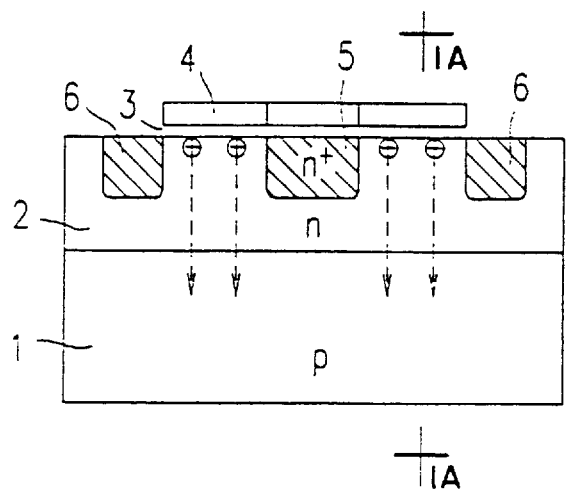
FIG. 1B is a cross-sectional view of the pixel taken along the G—G line in FIG. 1A.
Figure 2:
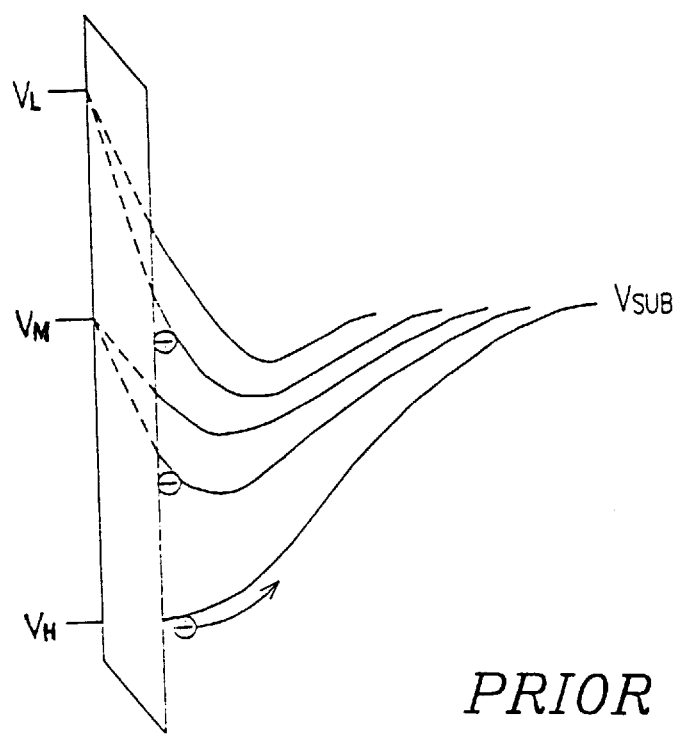
FIG. 2 shows the potential distribution in the depth-direction along the H—H line in FIG. 1B.
Figure 3A:
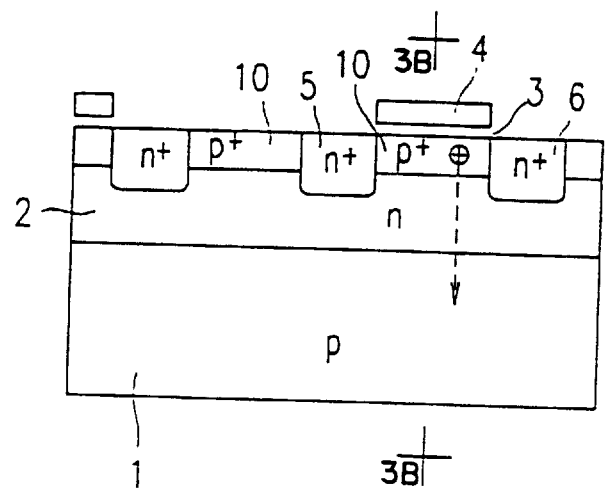
FIG. 3A is a cross-sectional view of a pixel of a conventional FGA type amplifying type solid-state imaging apparatus.
Figure 3B:
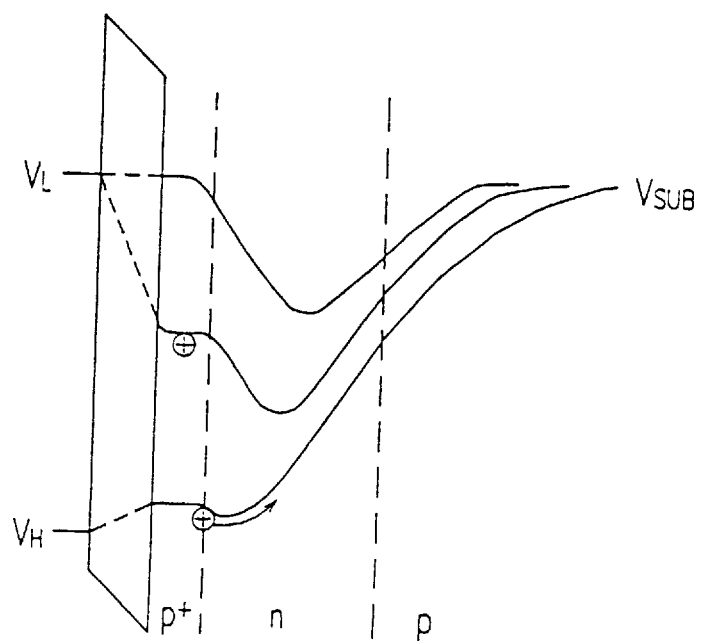
FIG. 3B shows the potential distribution in the depth-direction along the sectioning line K—K in FIG. 3A.
Figure 4A:
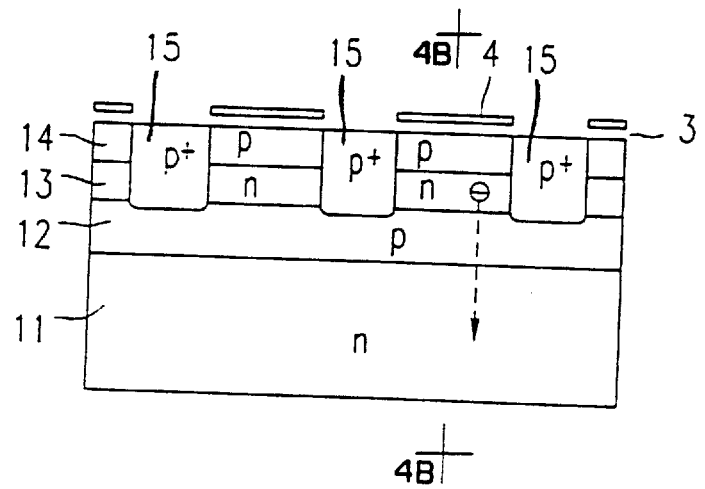
FIG. 4A is a cross-sectional view of a pixel of a conventional BCMD type amplifying type solid-state imaging apparatus.
Figure 4B:
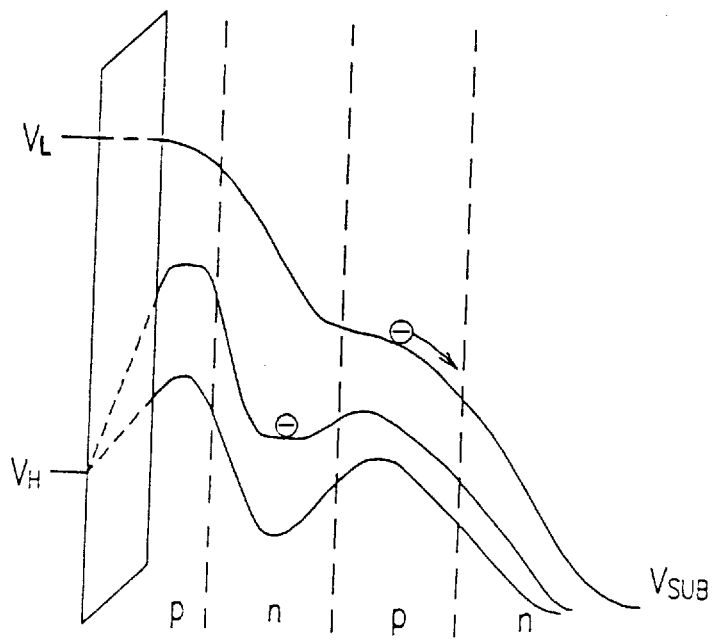
FIG. 4B is the potential distribution in the depth-direction along the sectioning line L—L in FIG. 4A.
Figure 5:
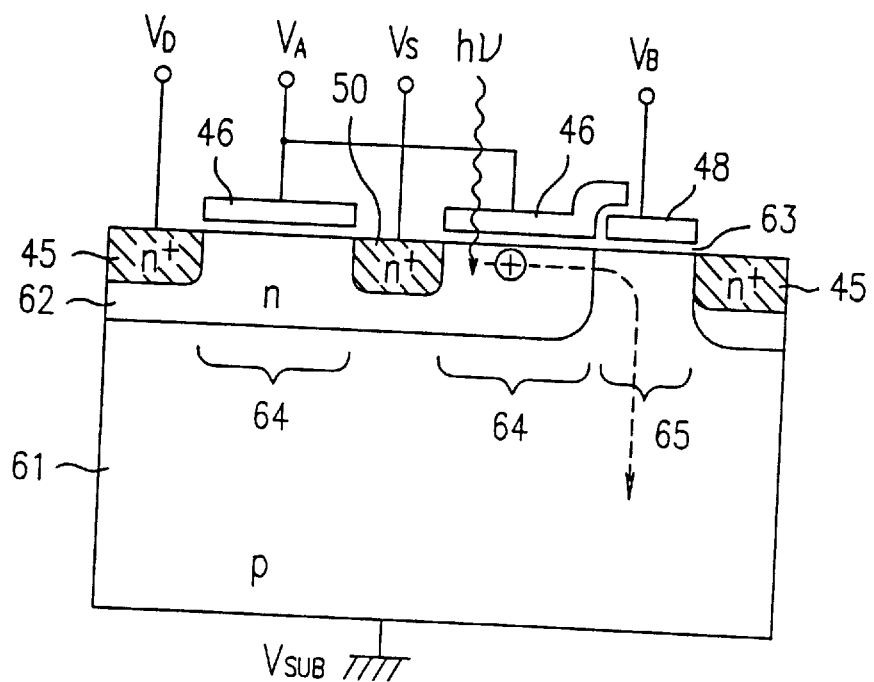
FIG. 5 is a cross-sectional view of a TGMIS type pixel previously proposed by the applicant of the present invention.
Figure 6:
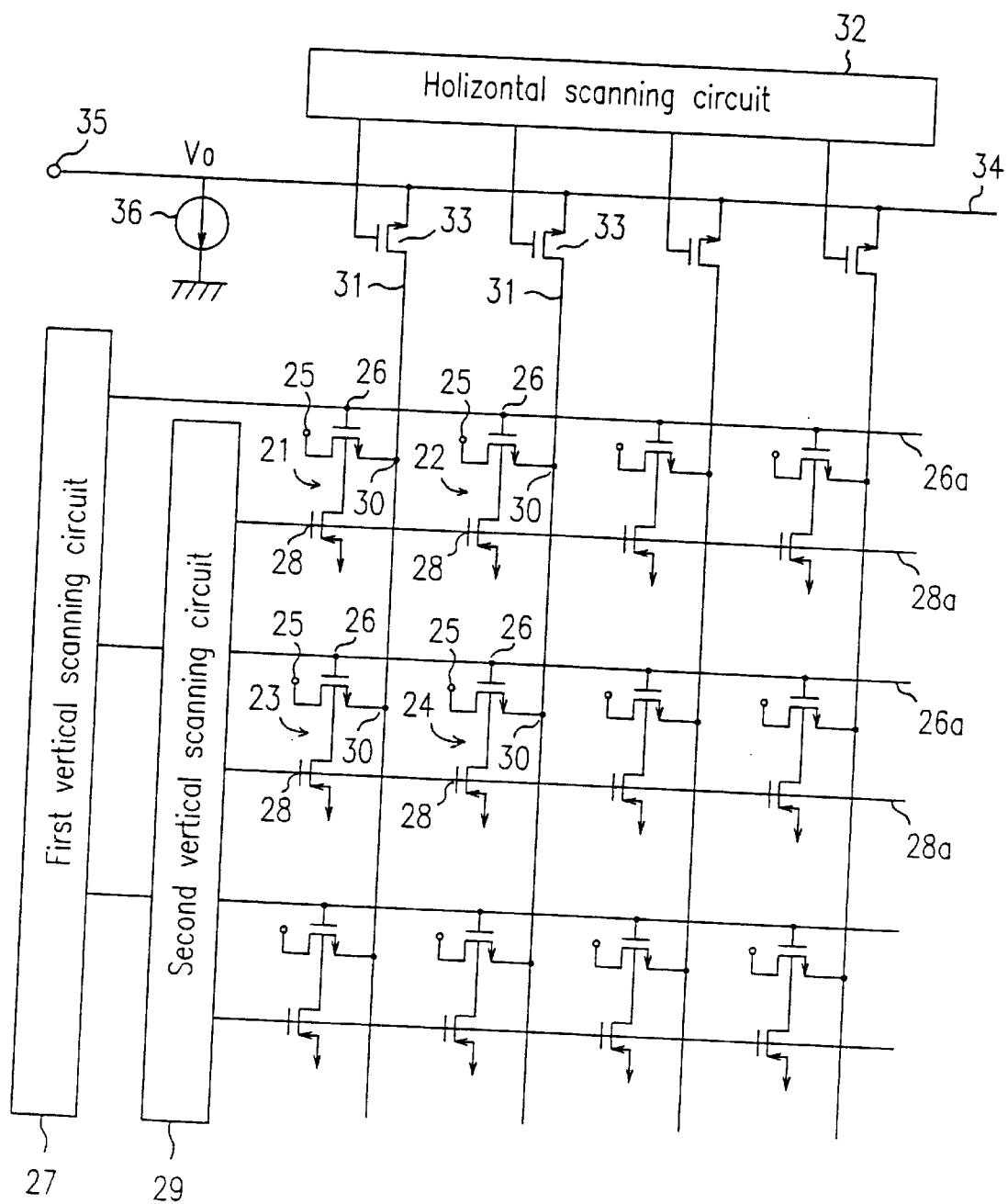
FIG. 6 schematically illustrates the structure of a two-dimensional amplifying-type solid-state imaging apparatus utilizing conventional amplifying type solid-state imaging devices.
Figure 7A:
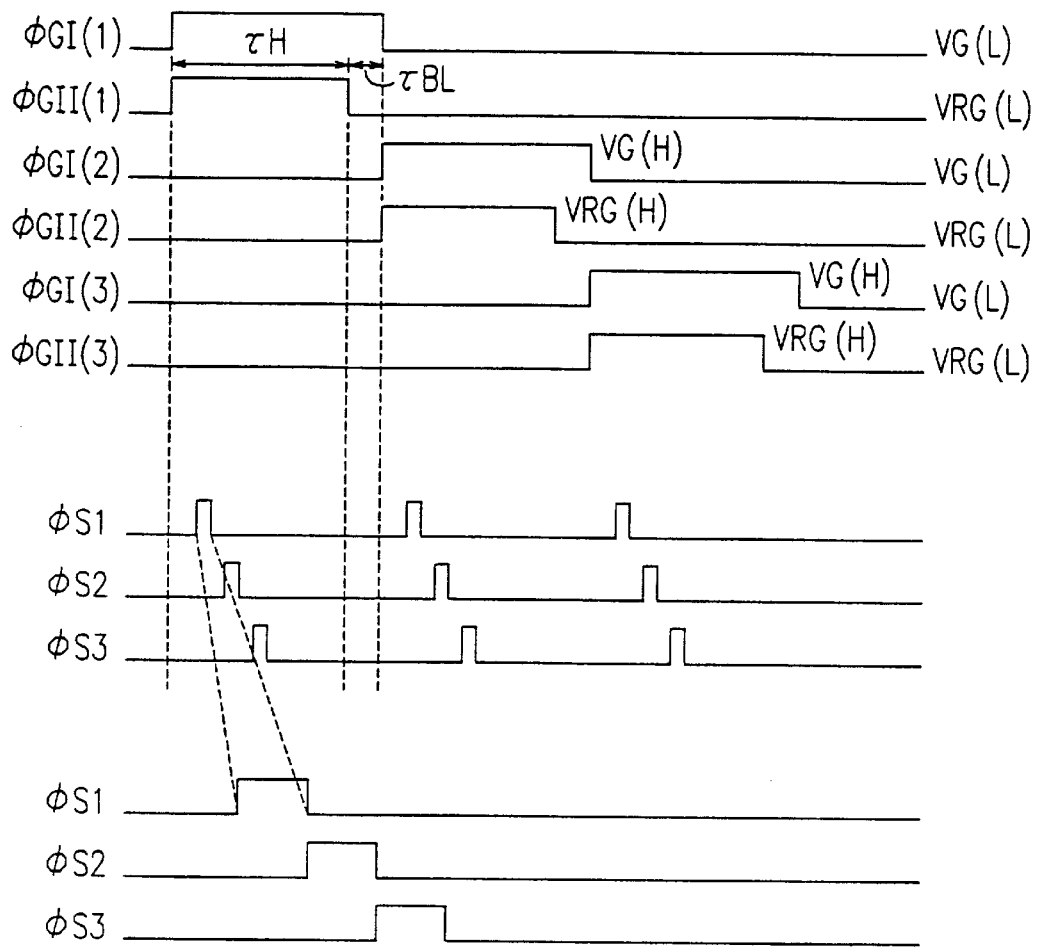
FIG. 7A is a timing chart for driving the two-dimensional amplifying type solid-state imaging apparatus in FIG. 6, an FIG. 7B is a structural diagram of its output signal.
Figure 7B:
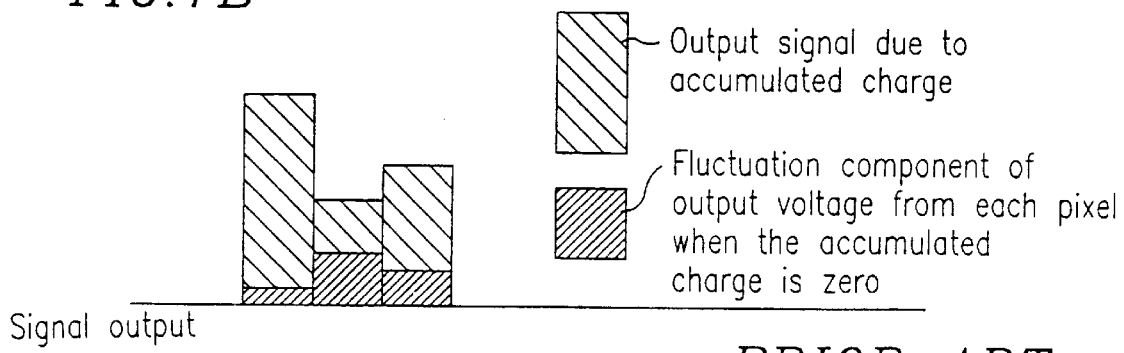

In the conventional TGMIS type amplifying type solid-state imaging device described with reference to FIG. 5, as the second gate electrode is miniaturized with a demand of achieving high packing density for the pixels, a three-dimensional potential ridge is formed in the discharge path for the accumulated charge due to the voltage applied to the source and the drain. This potential ridge prevents the accumulated charge from being discharged completely to the semiconductor substrate 61.

In the trench type pixel 41t illustrated in FIG. 24, a trench structure 19 having a predetermined depth is formed adjacent to the second gate electrode 48 on the surface of the semiconductor substrate so as to prevent the formation of the potential ridge. This trench structure 19 makes it possible to three-dimensionally alleviate the voltage applied to the source 50 and the drain 45, and to keep the channel through which an accumulated charge is discharged to the semiconductor substrate 61.

The trench structure 19 can be provided in such a manner that the whole area of the region of the semiconductor substrate adjacent to the second gate electrode 48 is used. Alternatively, when a resetting channel through which the accumulated charge can be completely discharged can be provided under the second gate region, the trench structure 19 can be provided in such a manner that the region of the semiconductor substrate adjacent to the second gate electrode 48 is partially used.

In the pixel 41t having the above-described trench structure 19, a photon having the energy hv entering through the first gate electrode 46 creates an electron-hole pair in the photoelectric conversion region of the n-type semiconductor well layer 62 due to photoelectric conversion. The electron thus created flows to the drain region 45. The positive hole, on the other hand, is confined by the potential barrier formed in the middle of the n-type semiconductor well layer 62, and the holes accumulate as a signal charge at the interface of the first gate region between the semiconductor and the insulating film. Then, the potential in the n-type semiconductor well layer 62 changes in accordance with the amount of the accumulated signal charge. This change is read out as a voltage change at the source 50, and becomes an output signal. As described here, the MOS transistor in each pixel functions as a photo sensor which outputs an electrical signal in accordance with the radiated light.

On the other hand, the discharge of the signal charge is readily performed by lowering the potential barrier under the second gate electrode 48 so that the accumulated charge flows into the semiconductor substrate 61 through the path illustrated by an arrow in FIG. 24. During the discharge, since the trench structure 19 prevents the formation of the potential ridge, the accumulated charge can completely be discharged by the resetting operation.

The structure other than the pixel 41t is similar to that of the amplifying type solid-state imaging apparatus 100 described in Embodiment 1. Therefore, the corresponding parts of the amplifying type solid-state imaging apparatus 600 illustrated in FIG. 23 are designated by the same reference numerals, and the detailed descriptions thereof are omitted.

Since the amplifying type solid-state imaging apparatus 600 of Embodiment 3 can also be operated by the same drive timing (i.e., read-out operation of a pixel signal from each pixel, clamp operation, sample hold operation, amplification and read-out operation, etc.) as the amplifying type solid-state imaging apparatus of Embodiment 1, a similar effect can be obtained.

(Embodiment 4)

Figure 25:
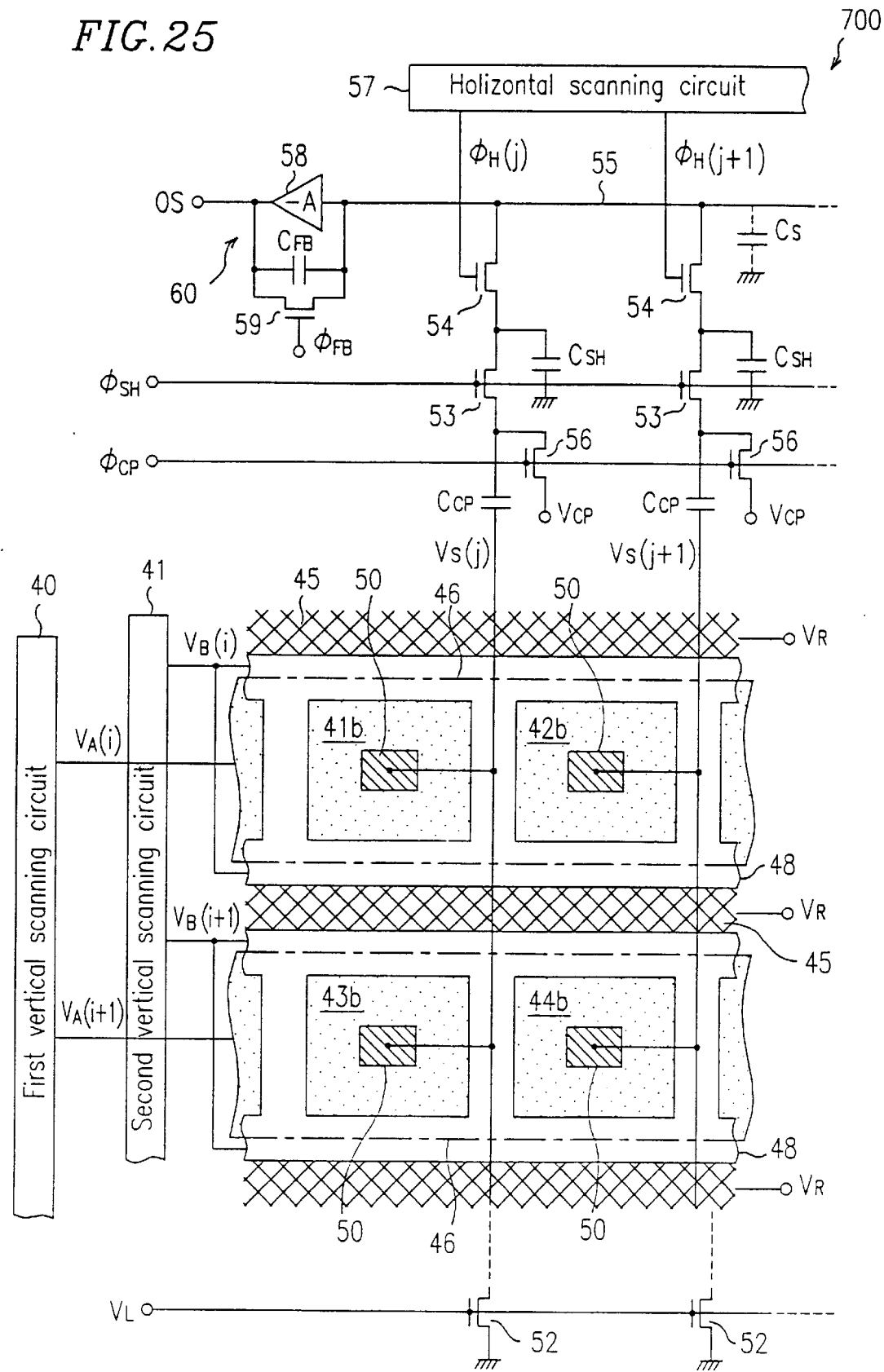
FIG. 25 schematically illustrates an amplifying type solid-state imaging apparatus according to Embodiment 4 of the present invention.

FIG. 25 schematically illustrates an amplifying type solid-state imaging apparatus 700 according to Embodiment 4 of the present invention. The structure of the pixel of the amplifying type solid-state imaging apparatus 700 according to Embodiment 4 differs from that of the amplifying type solid-state imaging apparatuses 100 to 600 according to Embodiments 1 to 3 described above. That is, a BDMIS (Bulk Drain MOS Image Sensor) type pixel 41b illustrated in FIG. 26 is used in Embodiment 4.

Figure 26:
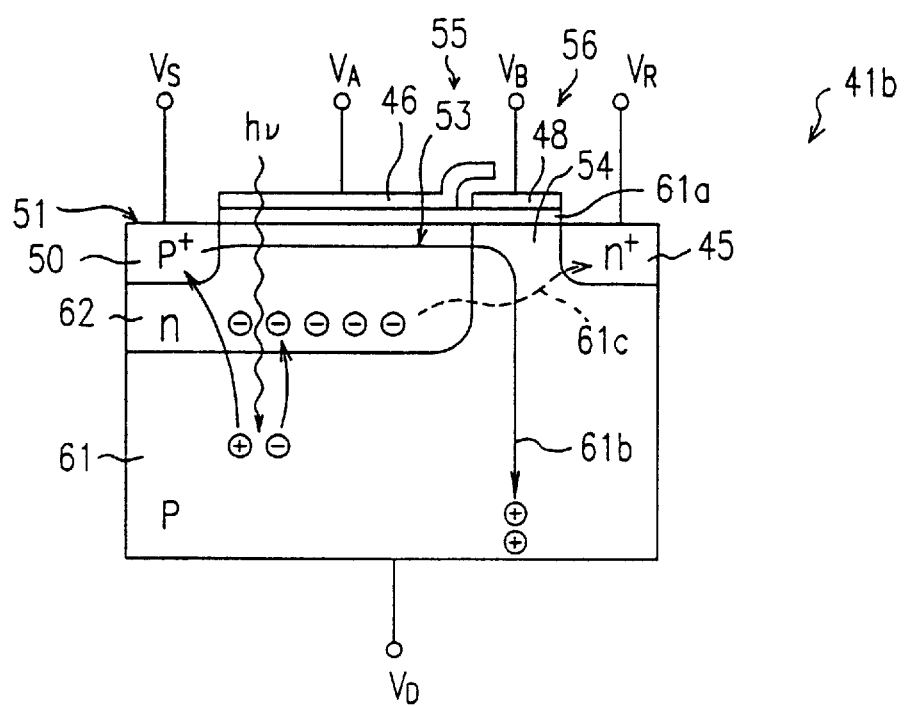
FIG. 26 is a cross-sectional view of a BDMIS type pixel.

FIG. 26 shows the structure of the pixel previously proposed in Japanese Patent Application No. 7-51641 (S95085, U.S. Ser. No. 08/612,369: . . . ) by the present applicant. In the pixel 41b, an n-type well layer 62 is formed in a p-type semiconductor substrate 61 in such a manner that the surface of the n-type well layer 62 is leveled with the main surface 51 of the p-type semiconductor substrate 61. Furthermore, a $p^+$-type semiconductor region 50 is formed in the n-type well layer 62 in such a manner that the surface of the $p^+$-type semiconductor region 50 is leveled with the main surface 51. A first gate electrode 46 is formed on the region of the well layer 62 exclusive of the semiconductor region 50 with an insulating film 61a being inserted therebetween. Moreover, a second gate electrode 48 is formed on the region of the substrate 61 adjacent to the well layer 62 also with the insulating film 61a being inserted therebetween. The surface-proximate portion 53 of the well layer 62, the insulating film 61a and the first gate electrode 46 constitute a first gate region 55. Moreover, the surface-proximate portion 54 of the substrate 61 on which the insulating film 61a is provided, the insulating film 61a and the second gate electrode 48 constitute a second gate region 56.

When an appropriate voltage is applied to the first gate electrode 46, a p-channel for positive holes which are a minority carrier is formed in the surface-proximate portion 53 of the first gate region 55. Moreover, when an appropriate voltage is applied to the second gate electrode 48, the entire portion of the substrate 61 which is under the second gate electrode 48 and includes the surface-proximate portion 54 of the second gate region 56 forms a p-channel. Therefore, a channel for having an electrical current due to positive holes is formed between the substrate 61 to which a voltage $V_D$ is applied and the semiconductor region 50 to which a voltage $V_S$ is applied, and the current flows as illustrated by the solid line 61b in FIG. 26.

When a photon having the energy hv enters through the first gate electrode 46 of the pixel 41b, an electron-hole pair is created due to photoelectric conversion in the portions of the well layer 62 and the semiconductor substrate 61 which are positioned under the first gate electrode 46. The hole thus created flows to the semiconductor region 50. The electron, on the other hand, accumulates in the potential well formed in the middle of the well layer 62, and becomes a signal charge. Electrons which become this signal charge are a majority carrier in the well layer 62. The accumulated signal charge changes the potential in the well layer 62 in accordance with the amount of the charge, and further changes the surface potential in the surface-proximate portion 53 of the first gate region 55.

Therefore, the current flowing from the substrate 61 to the semiconductor region 50 changes in accordance with the amount of the accumulated signal charge. If a constant current is to flow from the substrate 61 to the semiconductor region 50, then the voltage between the substrate 61 and the semiconductor region 50 changes in accordance with the amount of the accumulated signal charge. Alternatively, if a constant voltage is to be kept between the substrate 61 and the semiconductor region 50, the current flowing from the substrate 61 to the semiconductor region 50 changes in accordance with the amount of the accumulated signal charge. As described above, a first transistor which has the surface-proximate portions 53 and 54 of the first and second gate regions 55 and 56, respectively, as a channel is formed between the substrate 61 and the semiconductor region 50, and electrical characteristics of the active device change in accordance with the amount of the accumulated signal charge. Furthermore, a resetting drain region 45 is provided in the substrate 61 in such a manner that it makes contact with the surface-proximate portion 54 of the second gate region 56 on the side where the first gate region 55 is not provided and its surface is leveled with the main surface 51 of the substrate 61. By applying an appropriate voltage to the second gate electrode 48 so as to lower the potential barrier in the surface-proximate portion 54 of the second gate region, the signal charge accumulated in the well layer 62 flows to the resetting drain region 45 along the path indicated by the broken line 61c in FIG. 26. As described, a second transistor which has the surface-proximate portion 54 of the second gate region 56 between the well layer 62 and the resetting drain region 45 as a channel is formed, thereby achieving the discharge of the signal charge.

The structure of the amplifying type solid-state imaging apparatus 700 other than the pixel 41b is similar to the amplifying type solid-state imaging apparatus 100 described in Embodiment 1, and the corresponding parts of the amplifying type solid-state imaging apparatus 700 illustrated in FIG. 25 are designated by the same reference numerals.

Since the amplifying type solid-state imaging apparatus 700 of Embodiment 4 can also be operated by the same drive timing (i.e., read-out operation of a pixel signal from each pixel, clamp operation, sample hold operation, amplification and read-out operation, etc.) as the amplifying type solid-state imaging apparatus of Embodiment 1, a similar effect can be obtained.

(Embodiment 5)

Figure 27:
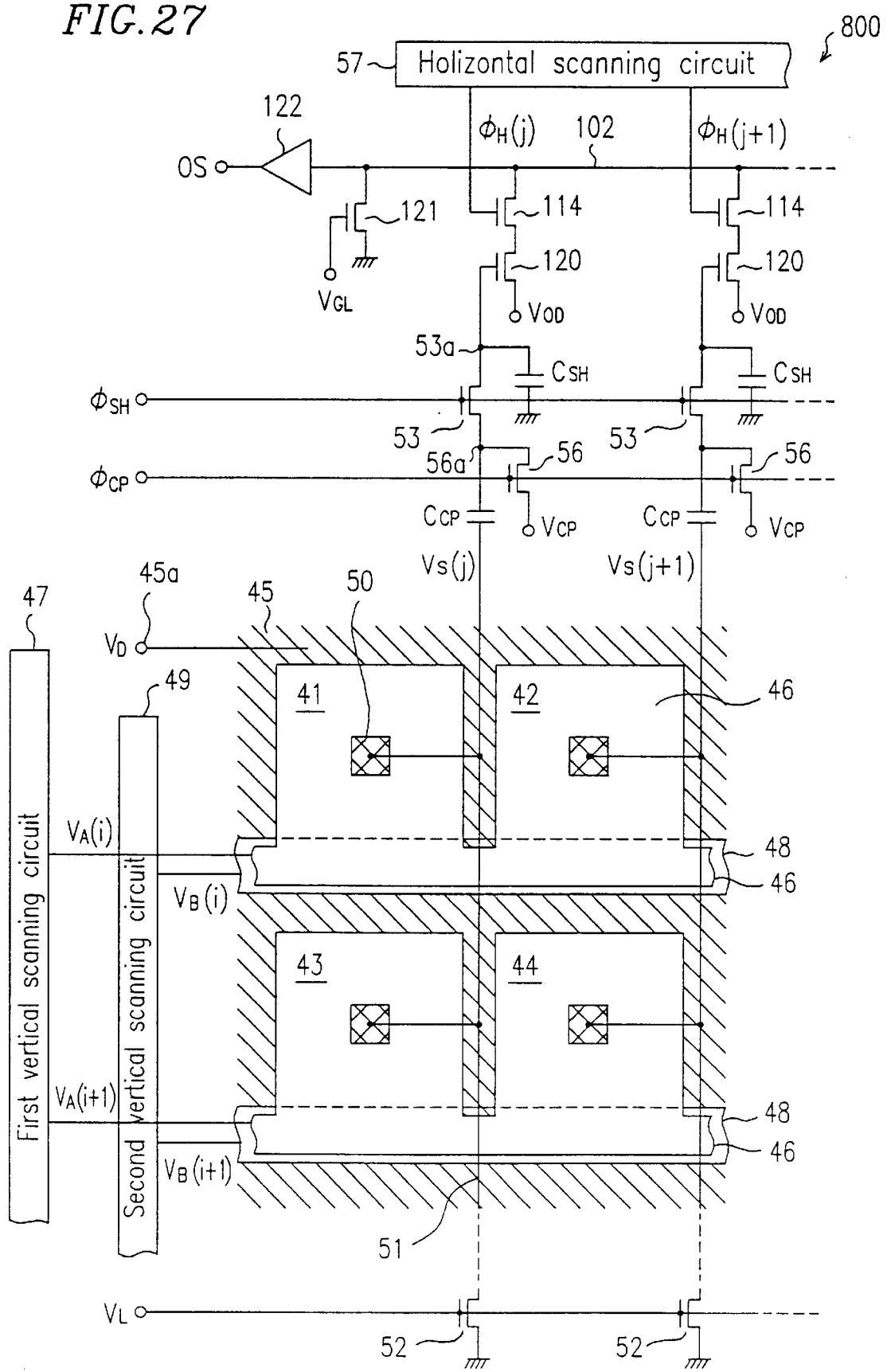
FIG. 27 schematically illustrates an amplifying type solid-state imaging apparatus according to Embodiment 5 of the present invention.

FIG. 27 illustrates an amplifying type solid-state imaging apparatus 800 according to Embodiment 5. In the amplifying type solid-state imaging apparatus 800 according to Embodiment 5, a source follower circuit (driver MOS transistors 120 and load MOS transistors 121) is provided on the after stage of the sample hold circuit (MOS transistors 53 and sample hold capacitor $C_{SH}$). A signal from the signal line 51 is led to the output signal line 102 via the driver MOS transistor 120 by the switching device 114.

The structure of the pixel of the amplifying type solid-state imaging apparatus 800 can be that of any pixel according to the above-described embodiments. In FIG. 27, the pixel (FIG. 9) used in the amplifying type solid-state imaging apparatus 100 is illustrated.

In Embodiment 5, a clamp circuit is also made of a clamp capacitor $C_{CP}$, a MOS transistor 56 and an operation voltage source $V_{CP}$.

Hereinafter, the structure and operation of the amplifying type solid-state imaging apparatus 800 will be described with reference to FIG. 27 while stress is being placed on parts different from the above-described embodiments. A signal held in the sample hold capacitor $C_{SH}$ is applied to the gate of the driver MOS transistor 120, and is led to the output signal line 102 via a signal line selection MOS transistor 114. The MOS transistor 121 is connected to the signal line 102, and a constant current load is provided by a constant voltage $V_{GL}$ applied to the gate of the MOS transistor 121. Because of this, the MOS transistors 120 and 121 constitute the source follower circuit to perform impedance conversion. For this reason, even if the stray capacitance of the signal line 102 is large, the signal held in the sample hold capacitor $C_{SH}$ does not attenuate but is sent to the signal line 102. Therefore, sufficient drive capability is maintained.

According to the structure of the amplifying type solid-state imaging apparatus 800 illustrated in FIG. 27, the signal held in the sample hold capacitor $C_{SH}$ is not directly read out. Therefore, as in an amplifying type solid-state imaging apparatus 900 to be described in the following, it becomes possible to read out the same signal for a plurality of times by providing a plurality of output signal lines.

Figure 28:
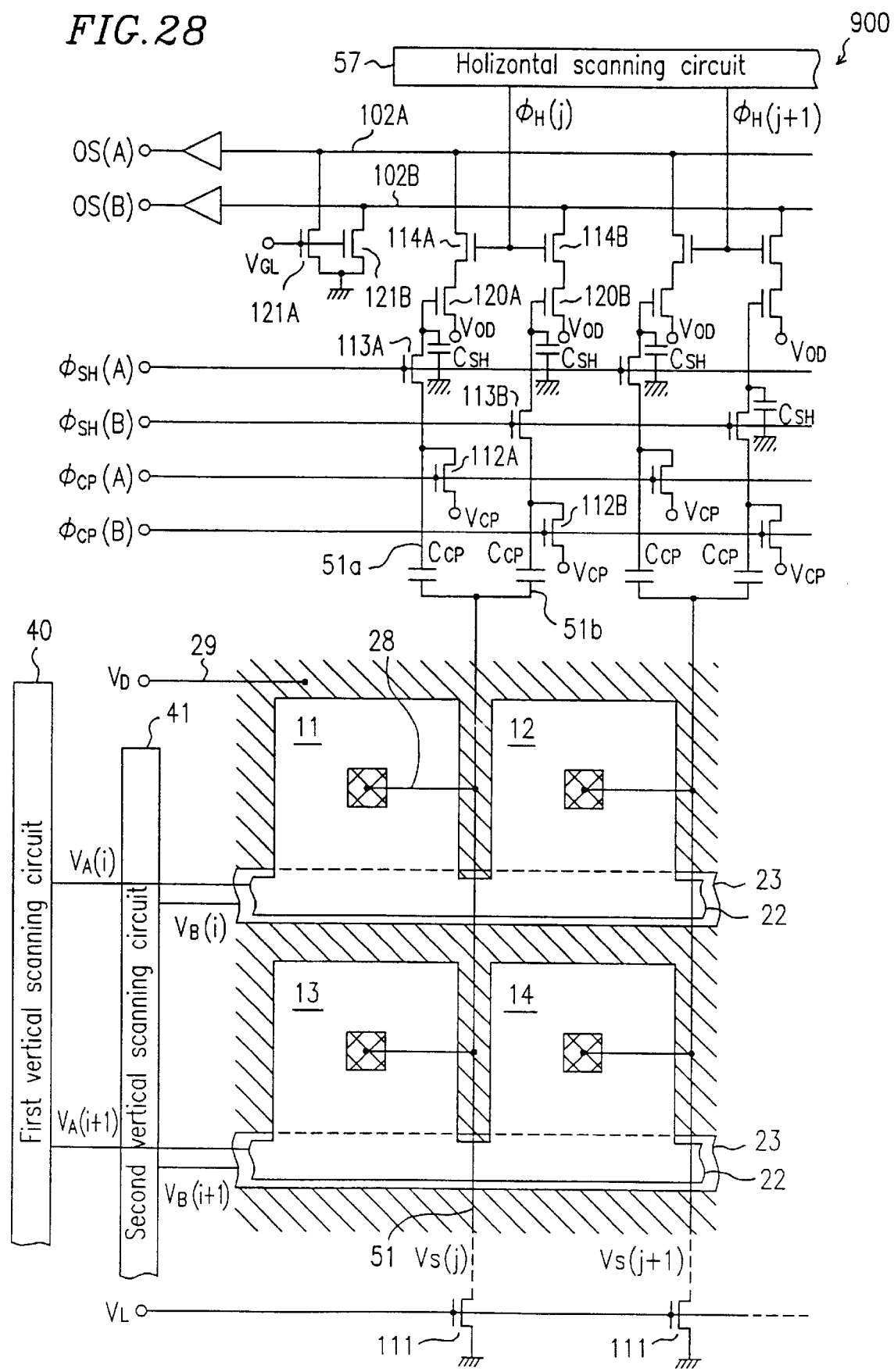
FIG. 28 schematically illustrates an example where a multiplex read-out is performed by using the amplifying type solid-state imaging apparatus illustrated in FIG. 27.

FIG. 28 illustrates another amplifying type solid-state imaging apparatus 900 according to Embodiment 5. The amplifying type solid-state imaging apparatus 900 is capable of reading out the same pixel signal for a plurality of times, i.e., of performing a multiplex read-out. The structure will be described in the following. The structure of the pixel of the amplifying type solid-state imaging apparatus 900 can be that of any pixel according to the above-described embodiments. In FIG. 28, the pixel (FIG. 9) used in the amplifying type solid-state imaging apparatus 100 is illustrated.

In Embodiment 5, an impedance conversion circuit is provided on the after stage of the sample hold circuit (MOS transistor 53 and sample hold capacitor $C_{SH}$). A signal from the signal line 51 is led to the output signal line 102 via a driver MOS transistor 120 by a switching device 114.

As illustrated in FIG. 28, in the amplifying type solid-state imaging apparatus 900, the signal line 51 is branched into signal lines 51a and 51b on the output side. The signal line 51a has a clamp circuit (clamp capacitor $C_{CP}$, MOS transistor 112A and operation voltage source $V_{CP}$), a sample hold circuit (MOS transistor 113B and sample hold capacitor $C_{SH}$) and a source follower circuit (impedance conversion circuit: driver MOS transistor 120A and load MOS transistor 121A). Similarly, the signal line 51b has a clamp circuit (clamp capacitor $C_{CP}$, MOS transistor 112B and operation voltage source $V_{CP}$), a sample hold circuit (MOS transistor 113B and sample hold capacitor $C_{SH}$) and an impedance conversion circuit (source follower circuit: driver MOS transistor 120B and load MOS transistor 121B).

Signals from the driver MOS transistors 120A and 120B of a pair of impedance conversion circuits are led to the signal lines 102A and 102B, respectively, via the switching devices 114A and 114B, respectively, which are driven by a common clock. In the following description, a constituting element with a reference numeral whose last digit is A (a system for the signal line 51a) is referred to as being in the group A, and a constituting element with a reference numeral whose last digit is B (a system for the signal line 51b) is referred to as being in the group B.

Figure 29:
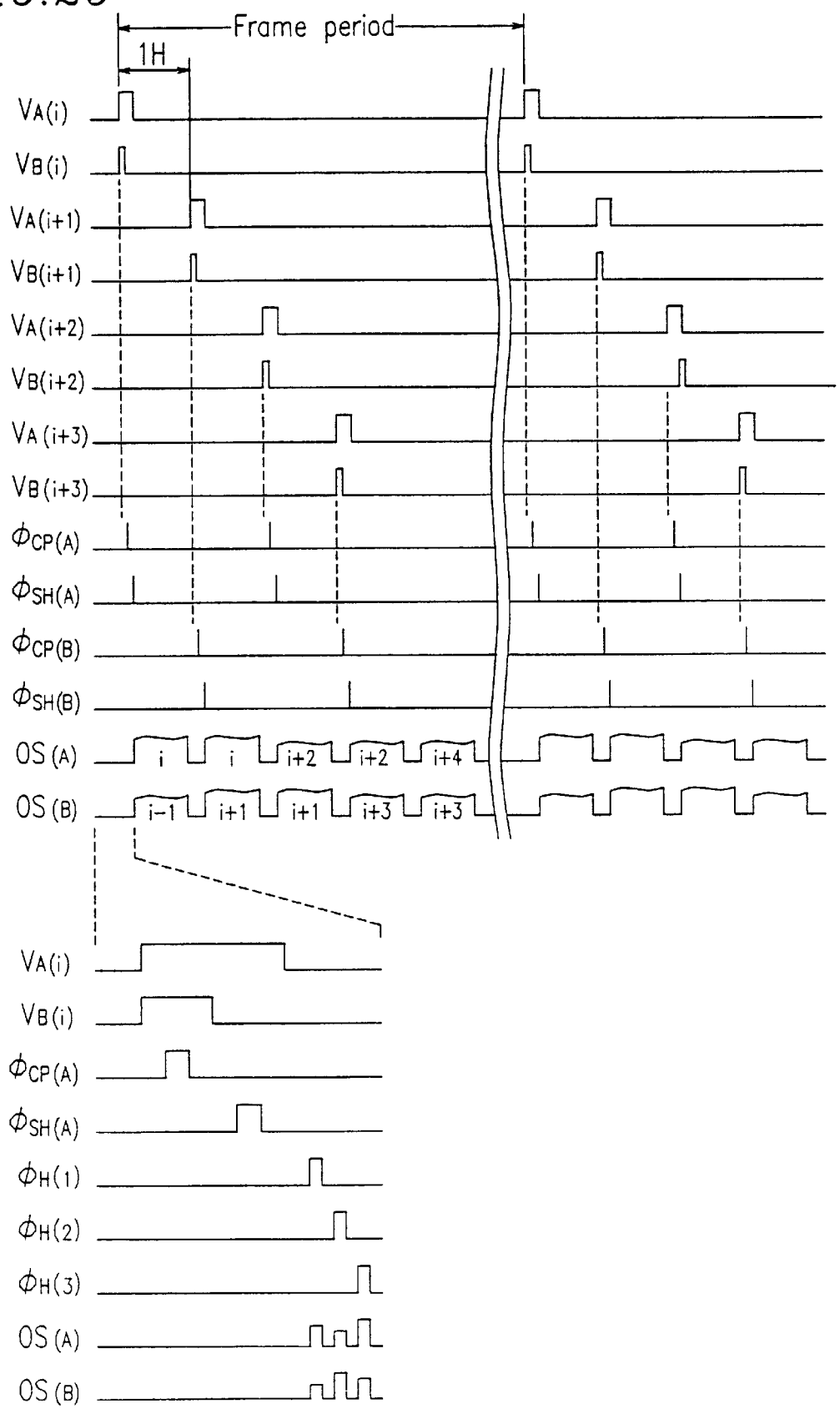
FIG. 29 is a timing chart illustrating the operation of the amplifying type solid-state imaging apparatus illustrated in FIG. 28.

FIG. 29 is a timing chart illustrating the operation of the amplifying type solid-state imaging apparatus 900. As illustrated in FIG. 29, the pixel is successively driven with a cycle of one horizontal scanning period H for every horizontal line as in a regular pixel. The clamp circuit and the sample hold circuit alternately operate with a cycle of 2H for each group. For example, the group A operates in the odd-numbered horizontal scanning period H, and the group B operates in the even-numbered horizontal scanning period H.

Since each of selection clocks $\phi_H(1)$, $\phi_H(2)$, $\phi_H(3)$, etc. from the horizontal scanning circuit 57 are applied to both the switching device 114A of the group A and the switching device 114B of the group B, output signals OS(A) and OS(B) of both group are obtained by the same timing. However, since the operation timings differ by 1H period, the contents thereof differ by 1H between them. For this reason, numbers of the horizontal pixel lines obtained from the output terminal of the groups A and B, namely, OS(A) and OS(B) are shifted by one line such as (i, i−1), (i, i+1), (i+2, i+1), (i+2, i+3), etc. For this reason, according to the present embodiment, it is extremely useful for single plate colorization or for processing the signal between pixels.

Although, in the figure, the case of the read-out of double/two lines is illustrated, the present invention can be similarly applied to the case of the triple/three lines or more.

As described above, according to the amplifying type solid-state imaging apparatus of the present invention, a predetermined voltage is clamped by a clamp means during the operation of reading-out a signal, and a voltage which corresponds to a difference signal between the clamped predetermined voltage and a pixel signal voltage during the zero signal charge, whose voltage drops during the resetting operation, is sample-held by a sample hold means via the clamp means. Therefore, a net pixel signal can be obtained. As a result, a fixed pattern noise due to the fluctuation of the off-set level for each pixel is suppressed.

Moreover, a capacitor means and a switch means are connected in parallel between the input end and the output end of an amplifier means provided on the after stage of the sample hold means, and the switch means is turned on for a predetermined time and then turned off so as to reset the charge in the capacitor means immediately before one pixel worth of signal reaches the input end of the amplifying means. Therefore, only the capacitor means appears to be a load on the output side of the sample hold means. As a result, the effect of the stray capacitance accompanying the output side can be suppressed.

Moreover, according to the amplifying type solid-state imaging apparatus according to the present invention, an impedance conversion means is provided on the after stage of the sample hold means, and the output end of the impedance conversion means is connected to a signal line via a selection switch means. Therefore, a sufficient drive capability can be maintained even if the stray capacitor is accompanied on the output side of the sample hold means.

Moreover, according to the amplifying type solid-state imaging apparatus of the present invention, each of a plurality of groups, which is made of a clamp means, a sample hold means and an impedance conversion means, is connected to a signal line. Each of the plurality of groups is connected to one of a plurality of signal lines via a selection switch. Therefore, each pixel signal is once held on the input side of the impedance conversion means, and a plurality of read-out operations for the same pixel signal become possible. That is, a multiplex read-out becomes possible.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An amplifying type solid-state imaging apparatus, comprising:
    an amplifying type photoelectric conversion device comprising: a transistor formed on a surface of a semiconductor substrate, said transistor accumulating a charge generated by incident light as a signal charge in a charge accumulation region proximate to the surface of said semiconductor substrate and outputting a signal in accordance with said accumulated signal charge; and a resetting means provided adjacent to said transistor, said resetting means performing a resetting operation wherein said signal charge accumulated in said transistor is discharged from said charge accumulation region based on an applied voltage;
    a signal line for carrying a signal output from said transistor of said amplifying type photoelectric conversion device;
    a clamp circuit connected to said signal line, for clamping the voltage of said signal line at a first voltage;
    a sample hold circuit connected to said clamp circuit, for sample-holding a difference signal representing a difference between said first voltage and a second voltage output from said transistor after said resetting operation;
    an output line connected to said sample hold circuit; and
    a controlling circuit for controlling said clamp circuit and said sample hold circuit and for reading out said difference signal held in said sample hold circuit to said output line.

2. An amplifying type solid-state imaging apparatus according to claim 1, wherein said resetting means comprises a gate region which is provided adjacent to said charge accumulation region and includes a part of the surface of said semiconductor substrate, and a gate electrode formed on said part of the surface of said semiconductor substrate with an insulating film being inserted therebetween, said accumulated signal charge being transferred from said charge accumulation region to the inside of said semiconductor substrate in accordance with a voltage applied to said gate electrode.

3. An amplifying type solid-state imaging apparatus according to claim 1, wherein:
    said transistor comprises a first gate region including a first gate electrode formed on the surface of said semiconductor substrate and said charge accumulation region, and a source region and a drain region which are formed on said semiconductor substrate as a high impurity concentration layer, said signal being output from said source region in accordance with said signal charge;
    said resetting means comprises
        a channel region which is a part of said semiconductor substrate proximate to the surface and adjacent to said charge accumulation region;
        a charge discharge drain region provided as a high impurity concentration layer adjacent to said channel region; and
        a second gate electrode provided on said channel region and said charge discharge drain region with an insulating film being inserted therebetween, said first gate electrode adjoining thereby;
    said resetting means transferring said signal charge accumulated in said charge accumulation region, based on a voltage applied to said second gate electrode, from said charge accumulation region to said charge discharge drain region via said channel region.

4. An amplifying type solid-state imaging apparatus according to claim 1, wherein:
    said amplifying type solid-state imaging apparatus comprises a plurality of said amplifying type photoelectric conversion devices arranged in a one-dimensional or two-dimensional matrix configuration;
    each of said plurality of amplifying type photoelectric conversion devices being such that:
        said transistor comprises a first gate region including a first gate electrode formed on the surface of said semiconductor substrate and said charge accumulation region, and a source region and a drain region which are formed on said semiconductor substrate as a high impurity concentration layer, said signal being output from said source region in accordance with said signal charge;
        said resetting means comprises a second gate region which is provided adjacent to said charge accumulation region and includes a part of the surface of said semiconductor substrate, and a second gate electrode formed on said second gate region with an insulating film being inserted therebetween, said signal charge accumulated in said charge accumulation region being transferred, based on a voltage applied to said second gate electrode, from said charge accumulation region to the inside of said semiconductor substrate via said second gate region; and
        an electric field blocking part is provided between said second gate region of said resetting means of one of said plurality of amplifying type photoelectric conversion devices and said transistor of an amplifying type photoelectric conversion device adjacent to said one of the plurality of amplifying type photoelectric conversion devices.

5. An amplifying type solid-state imaging apparatus according to claim 4, wherein said electric field blocking part is a trench structure provided to said semiconductor substrate.

6. An amplifying type solid-state imaging apparatus according to claim 1, wherein a constant current circuit is connected to said signal line.

7. An amplifying type solid-state imaging apparatus according to claim 1, wherein an amplifying circuit for said output line is provided, and a capacitor device and a switching device are provided in parallel between an input terminal and an output terminal of said amplifying circuit.

8. An amplifying type solid-state imaging apparatus according to claim 7, wherein a second controlling circuit which turns on said switching device for a predetermined time and then turns off immediately before one pixel worth of said difference signal is input to said input terminal of said amplifying circuit.

9. An amplifying type solid-state imaging apparatus according to claim 1, further comprising:

an impedance conversion circuit connected to said sample hold circuit; and a selection switch device connected between an output end of said impedance conversion circuit and said output line.

10. An amplifying type solid-state imaging apparatus according to claim 9, wherein:

said amplifying type solid-state imaging apparatus comprises a plurality of groups of said clamp circuit, said sample hold circuit, said impedance conversion circuit, said selection switch device and said output line;

said signal line connected to said amplifying type photoelectric conversion device is connected in parallel to said plurality of said clamp circuits;

corresponding said sample hold circuit and said impedance conversion circuit are respectively connected to said plurality of said clamp circuits;

the output end of said impedance conversion circuit is connected to corresponding said output line via corresponding said selection switch device.

11. An amplifying type solid-state imaging apparatus, comprising:

an amplifying type photoelectric conversion device comprising: a first region provided in a semiconductor substrate so as to include a part of a surface of said semiconductor substrate, for accumulating a charge generated by photoelectric conversion as a signal charge;

a first drain region which is a high impurity concentration layer formed in said first region; a first gate region including a surface-proximate portion of said substrate of said first region excluding said first drain region, an insulating film formed on said first region, and a first electrode formed on said insulating film;

a second gate region including a second region provided adjacent to said first gate region, and a second gate electrode provided on said second region with said insulating film being inserted therebetween;

a second drain region provided to the outside of said first region and adjacent to said second region; wherein a first transistor having said surface-proximate region of said substrate of said first region as a channel is formed between said first drain region and said semiconductor substrate, and a second transistor having a region between said first region and said second drain region as a channel is formed, a change in an operational characteristic of said first transistor which is generated by said signal charge being used as an output signal;

a signal line for carrying a signal output from said transistor of said amplifying type photoelectric conversion device;

a clamp circuit connected to said signal line, for clamping a voltage of said signal line at a first voltage;

a sample hold circuit connected to said clamp circuit, for sample-holding a difference signal representing a difference between said first voltage and a second voltage output from said transistor after said resetting operation;

an output line connected to said sample hold circuit; and a controlling circuit for controlling said clamp circuit and said sample hold circuit and for reading out said difference signal held in said sample hold circuit to said output line.

12. An amplifying type solid-state imaging apparatus according to claim 11, wherein said signal line is connected to a constant current circuit.

13. An amplifying type solid-state imaging apparatus according to claim 11, wherein an amplifying circuit for said output line is provided, and a capacitor device and a switching device are provided in parallel between an input end and an output end of said amplifying circuit.

14. An amplifying type solid-state imaging apparatus according to claim 13, wherein a second controlling circuit which turns on said switching device for a predetermined time and then turns off immediately before one pixel worth of said difference signal is input to said input terminal of said amplifying circuit.

15. An amplifying type solid-state imaging apparatus according to claim 11, further comprising:

an impedance conversion circuit connected to said sample hold circuit; and a selection switching device connected between an output end of said impedance conversion circuit and said output line.

16. An amplifying type solid-state imaging apparatus according to claim 15, wherein:

said amplifying type solid-state imaging apparatus comprises a plurality of groups of said clamp circuit, said sample hold circuit, said impedance conversion circuit, said selection switch device and said output line;

said signal line connected to said amplifying type photoelectric conversion device is connected in parallel to said plurality of said clamp circuits;

corresponding said sample hold circuit and said impedance conversion circuit are respectively connected to said plurality of said clamp circuits; and the output end of said impedance conversion circuit is connected to corresponding said output line via corresponding said selection switch device.

17. A method for driving an amplifying type solid-state imaging apparatus, said amplifying type solid-state imaging apparatus comprising:

an amplifying type photoelectric conversion device, comprising a transistor formed on a surface of a semiconductor, said transistor accumulating a charge generated by incident light as a signal charge in a charge accumulation region proximate to the surface of said semiconductor substrate and outputting a signal in accordance with said signal charge; and a signal line for carrying a signal output from said transistor; said method comprising the steps of:

outputting a signal in accordance with accumulated said signal charge from said transistor of said amplifying type photoelectric conversion device to said signal line;

clamping a voltage of said signal line at a first voltage;

discharging said signal charge accumulated in said transistor from said charge accumulation region, thereby outputting a second voltage from said transistor;

sample-holding a difference signal representing a difference between said first voltage and said second voltage; and reading out said sample-held difference signal.

* * * * *